United States Patent
Spahlinger et al.

(10) Patent No.: US 9,356,607 B2
(45) Date of Patent: May 31, 2016

(54) CONTROLLER UNIT AND DEVICE FOR RESETTING AN OSCILLATOR EXCITED BY A HARMONIC OSCILLATION, AND YAW RATE SENSOR

(75) Inventors: Günter Spahlinger, Stutgart (DE); Markus Ruf, Waldkirch (DE)

(73) Assignee: Northrop Grumman Litef GmbH (DE)

( * ) Notice: Subject to any disclaimer, the term of this patent is extended or adjusted under 35 U.S.C. 154(b) by 376 days.

(21) Appl. No.: 13/994,692

(22) PCT Filed: Dec. 15, 2011

(86) PCT No.: PCT/EP2011/006356
§ 371 (c)(1),
(2), (4) Date: Nov. 5, 2013

(87) PCT Pub. No.: WO2012/084153
PCT Pub. Date: Jun. 28, 2012

(65) Prior Publication Data
US 2014/0159822 A1    Jun. 12, 2014

(30) Foreign Application Priority Data
Dec. 22, 2010   (DE) .......................... 10 2010 055 631

(51) Int. Cl.
*H03L 7/00* (2006.01)
*G05B 5/01* (2006.01)

(52) U.S. Cl.
CPC ... *H03L 7/00* (2013.01); *G05B 5/01* (2013.01)

(58) Field of Classification Search
CPC ........... H03L 7/00; G05D 19/02; G01C 19/00
USPC ................ 331/25; 73/504.01, 504.02, 504.03
See application file for complete search history.

(56) References Cited

U.S. PATENT DOCUMENTS

| | | | | |
|---|---|---|---|---|
| 7,805,993 B2 * | 10/2010 | Spahlinger | ............. | G01C 19/56 702/145 |
| 8,032,324 B1 * | 10/2011 | Bryant | .................... | G01C 17/02 702/141 |
| 2003/0133495 A1 * | 7/2003 | Lerner | .............. | H04L 25/03834 375/139 |
| 2005/0187650 A1 | 8/2005 | Toyama et al. | | |

FOREIGN PATENT DOCUMENTS

| | | |
|---|---|---|
| CN | 2004-209176 U | 11/2005 |
| CN | 2743837 Y | 11/2005 |

(Continued)

OTHER PUBLICATIONS

Wang Jianhui et al., "The Principle of Automatic Control", Jan. 2005, 4th Edition, Metallurgical Industry Publishing House, pp. 43, 95, 96, 211, 279 through 285,405, 406.

*Primary Examiner* — Jeffrey Shin
(74) *Attorney, Agent, or Firm* — Tarolli, Sundheim, Covell & Tummino LLP

(57) ABSTRACT

A controller unit includes a PI-controller for harmonic command variables. The transfer function of the PI-controller has a conjugate complex pole at a controller angular frequency $\omega_r$ in the s-plane or a pole at $e^{\pm j\omega_r T}$ in the z-plane, wherein T is the sampling time of a discrete input signal of the PI-controller and $\omega_r$ is larger than 0. The controller angular frequency $\omega_r$ is chosen equal to the resonance angular frequency $\omega_0$ of an oscillator. The controller parameters, are, for example determined by pole/zero compensation. The controller unit allows, for example, a broad band control of harmonic oscillators in rotation rate sensors.

18 Claims, 18 Drawing Sheets

(56) References Cited

FOREIGN PATENT DOCUMENTS

| | | |
|---|---|---|
| DE | 10 2005 005248 A1 | 8/2005 |
| EP | 1227383 A1 | 7/2002 |
| JP | 2005-221845 | 8/2005 |
| KR | 10-2009-0105065 | 10/2009 |
| WO | WO 2009112526 A1 | 9/2009 |

* cited by examiner $$\frac{K_I}{K_P} \approx s_0 \quad vz = sign(K_I)$$

$$(T_S + T_R) \cdot \omega_0 = \frac{3}{2}\pi \quad \text{für} \quad vz = +1$$

$$(T_S + T_R) \cdot \omega_0 = \frac{1}{2}\pi \quad \text{für} \quad vz = -1$$

$$\frac{K_I}{K_P} \approx s_0 \quad vz = sign(K_I)$$

$$\left(\beta_S + \beta_D + \frac{1}{2}\right) \cdot \omega_0 \cdot T = \frac{3}{2}\pi \quad für \quad vz = +1$$

$$\left(\beta_S + \beta_D + \frac{1}{2}\right) \cdot \omega_0 \cdot T = \frac{1}{2}\pi \quad für \quad vz = -1$$

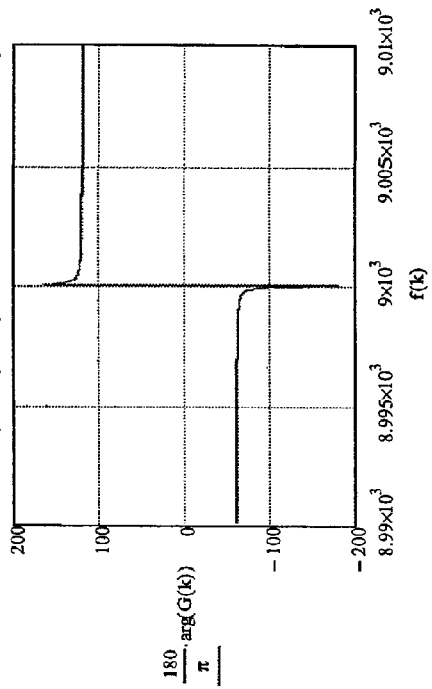
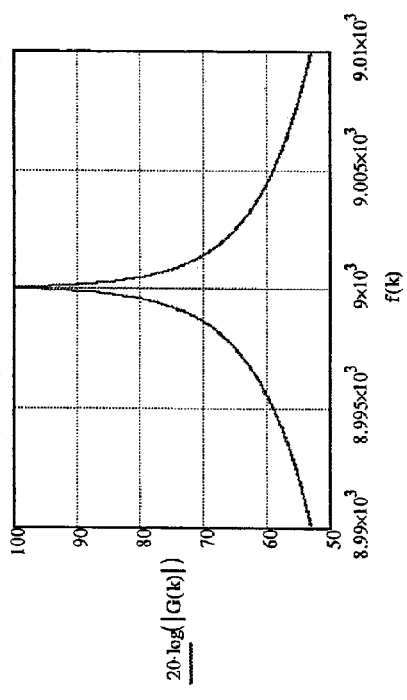
Fig. 3C
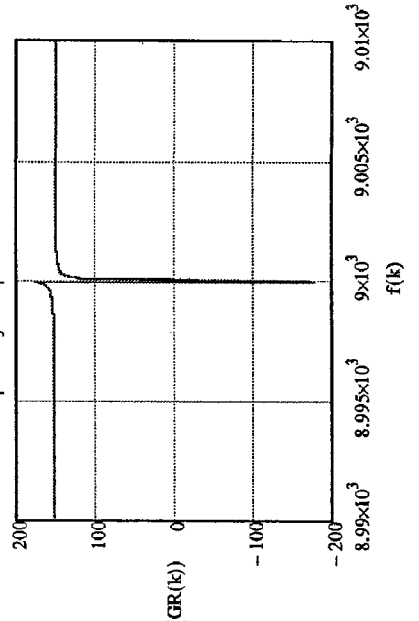
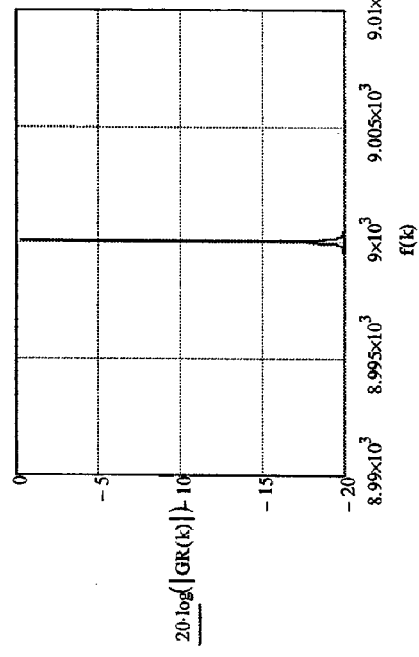

Step response

Phase frequency response of closed loop

Absolute value frequency response of closed loop f(k)

CONTROLLER UNIT AND DEVICE FOR RESETTING AN OSCILLATOR EXCITED BY A HARMONIC OSCILLATION, AND YAW RATE SENSOR

BACKGROUND

1. Field of the Invention

The invention refers to a controller unit for resetting a deflection of an oscillator excited with a harmonic oscillation, a device including such a controller unit, in particular a rotation rate sensor, as well as to a method for operating and for manufacturing such a controller unit.

2. Description of the Prior Art

Conventional control methods are tailored to control problems with constant or only slowly changing command variables. The value of a controlled process variable affected from a disturbance is kept close to a predetermined set point, or is updated as close as possible to a changing set point. Some applications (e.g. micromechanical rotation rate sensors for analysis of a Coriolis force) provide a control loop for resetting a deflection of an oscillator oscillating with its resonance frequency when stationary. A controller for such a control loop with a harmonic oscillation as command variable is conventionally designed such that a harmonic force signal exciting the oscillator is compensated so that the oscillator—apart form the harmonic oscillation corresponding to the command variable—performs as little movement as possible.

Typically, this feedback control problem is solved as illustrated in FIGS. 1A to 1D. FIG. 1A refers to a device 100 with a controlled system such as a mechanical oscillator 190, whose translational or rotational deflection is captured by a sensor 170. The oscillator 190 is supported or suspended such that it is movable along a direction of excitation and able to oscillate with a resonance angular frequency $\omega_0$. A harmonic force signal $F_e$ acts on the oscillator 190 along the direction of excitation. A measurement signal from the sensor 170 reproduces the movement of the oscillator 190 along the direction of excitation. The movement of the oscillator 190 includes a resonance oscillation with the resonance angular frequency $\omega_0$, modulated by a force F (disturbance).

The measurement signal (system output signal) is fed to a controller unit 120 with a demodulator 122. In the demodulator 122, the system output signal is multiplied with a harmonic signal of frequency $\omega_0$ which is equal to the resonance angular frequency $\omega_0$ of the oscillator 190, wherein a baseband version of the system output signal as well as additional frequency conversion products are formed. A low pass filter 124 damps higher frequency components, in particular at the double resonance angular frequency $2\cdot\omega_0$ of the oscillator 190. The baseband signal is fed to the controller 126, which operates in the baseband, whose design and dimensions can be established by known controller design methods. The controller 126 is, for example, a continuous PI-controller. Due to its integral component, high stationary position can be achieved in case of a constant command variable.

The output of the controller 125 is multiplied (modulated) with a harmonic signal of frequency $\omega_0$ equal to the resonance angular frequency $\square_0$ of the oscillator 190 in a modulator 128. The modulation product is fed to an actuator 180 as a controller signal, the actuator executing according to the controller signal a force to the oscillator 190 that acts opposite to the deflection of the oscillator 190. With the resonance angular frequency $\omega_0$ and the damping $s_0$ of the oscillator as well as with the amplification A and the system dead time $T_S$ of the system formed of the actuator 180, the oscillator 190 and the sensor 170, the transfer function of the oscillator 190 to be controlled is given by equation (1):

$$G(s) = \frac{A}{(s+s_o)^2 + w_0^2} \cdot e^{T_S \cdot s} = G_0(s) \cdot e^{-T_S \cdot s} \tag{1}$$

In what follows it is assumed that the damping $s_0$ of the oscillator 190 is much smaller than its resonance angular frequency ($s_0 \ll \omega_0$), and that the oscillator 190 is excited altogether with the harmonic force signal $F_e$, which has a force amplitude superposing, respectively amplitude modulating an exciting oscillation with the resonance angular frequency $\omega_0$ of the oscillator:

$$F_e = F \cdot \cos(\omega_0 \cdot T) \tag{2}$$

According to FIG. 1B the actuator 180, the oscillator 190 and the sensor 170 of FIG. 1A can then be illustrated as a system with a summation point 191 and a transfer function G(s). A controller signal generated by the controller unit 120 is added to the harmonic force signal $F_e$ at the summation point 191 and the transfer function G(s) acts on the sum signal according to equation (1).

The low pass filter 124 which has to show sufficient damping at the double resonance angular frequency of the oscillator to damp the frequency conversion product sufficiently at $2\cdot\omega_0$, limits the bandwidth of the controller and hence its reaction rate with respect to changes in the force amplitude F.

FIG. 1C schematically illustrates the signal u(t) at the output of a continuous PI-controller with transfer function $G_R(s)$. A constant input signal $x_d(t)$ at the controller input generates a time proportional gradient u(t) at the controller output.

For a continuous PI-controller with amplification factor $K_P$ and the integral action coefficient $K_I$ the step response u(t) is produced by a step signal $\sigma(t)$ as input signal according to equation (3):

$$u(t) = (K_P + K_I \cdot t) \cdot \sigma(t). \tag{3}$$

By L-transformation of $\sigma(t)$ and equation (3), the transfer function $G_R(s)$ follows:

$$G_R(s) = \frac{U(s)}{X_d(s)} = s \cdot \left(K_P \cdot \frac{1}{s} + K_I \cdot \frac{1}{s^2}\right) = K_P \cdot \frac{s + \frac{K_I}{K_P}}{s} \tag{4}$$

A pole at s=0 resulting from the integral component is characteristic for the continuous PI-controller. In a PI-controller used in connection with a controlled system of first order with a system function $G_s(s)$, the system parameter $K_s$, and the boundary angular frequency $\omega_1$ is, according to equation (5), $$G_S(s) = K_S \cdot \frac{1}{s + \omega_1} \tag{5}$$

then the controller parameter amplification factor $K_P$ and integral action coefficient $K_I$ are typically chosen so that the pole in the system function $G_S(s)$ (system pole) is compensated by the zero of the transfer function of the controller $G_R(s)$ (controller zero). Equating coefficients in the equations (4) and (5) results in a condition for the controller parameter given by the relation according to equation (6):

$$\omega_1 = \frac{K_I}{K_P} \tag{6}$$

Equation (6) determines only the ratio of the amplification factor $K_P$ to the integral action coefficient $K_I$. The product of the system transfer function $G_S(s)$ and controller transfer function $G_R(s)$ gives the transfer function of the corrected open loop $G_k(s)$. As the system pole according to equation (5) and the controller zero according to equation (4) cancel, the transfer function of the corrected open loop $G_k(s)$ is given by the relation according to equation (7).

$$G_k(s) = G_S(s) \cdot G_R(s) = K_S \cdot K_P \cdot \frac{1}{s} \tag{7}$$

From the corrected open loop frequency response, the stability properties of the closed loop can be deduced via the Nyquist criterion. Because of the integral characteristics of the corrected open loop an absolute value characteristic results which declines with 20 db/decade. The phase always amounts to −90° for positive frequencies, to which application of the Nyquist criterion is typically limited. The phase characteristic is an odd function and has, at frequency 0, a 180° step from +90° for negative frequencies to −90° for positive frequencies. The transfer function $G_w(s)$ for the closed loop generally results from that of the corrected open loop $G_k(s)$ according to equation (8):

$$G_w(s) = \frac{G_k(s)}{1 + G_k(s)} \tag{8}$$

From equation (8) it follows that the transfer function $G_w(s)$ for the closed loop is only stable when the locus of the corrected open loop neither encloses nor runs through the point −1 for $0 \le \omega < \infty$. One condition equivalent to this is that, at the transition of the absolute value characteristic of the corrected open loop through the 0 dB line, the phase of the corrected open loop is larger than −180°. As the phase is constant at −90° in the above case, the closed loop is thus always stable independent of the choice of amplification factor $K_P$.

The bandwidth of the closed loop can be deduced from the frequency at the transition of the absolute value characteristic through the 0 dB line. The absolute value frequency response can be shifted via the amplification factor $K_P$ along the ordinate and, thus, the transition through the 0 dB line, respectively influencing the bandwidth that results from it.

FIG. 1D illustrates, for one example with a controlled system of first order with the boundary angular frequency $\omega_1 = 2\cdot\pi\cdot 100$ Hz, a system parameter $K_S = \omega_1$ and a PI-controller whose controller zero is chosen to compensate the system pole and whose amplification factor is $K_P = 2$. The figure shows the absolute value frequency responses of controlled system, controller, corrected open loop, and closed loop in the left column from top to bottom and, in the right column from top to bottom, the phase frequency responses of the controlled system, controller, corrected open loop, and closed loop. As can be seen from the diagram at the bottom left, the bandwidth of the open loop defined by the frequency at which the absolute value frequency response of the closed loop has dropped by 3 dB amounts to approximately 100 Hz.

The use of a classical PI-controller assumes a comparatively constant common variable. For this reason applications in which a harmonic common variable of almost constant frequency is to be controlled require a demodulator and a downstream low pass filter, which generate a corresponding baseband signal from the harmonic input signal.

SUMMARY AND OBJECTS OF THE INVENTION

It is therefore the object of the invention to provide an improved controller concept for resetting the deflection of oscillators of the type that oscillate harmonically in the stationary case (e.g. the deflection of one of the movably supported units of a rotation rate sensor) affected by a disturbance.

The present invention addresses the preceding and other objects by providing, in a first aspect, a controller unit. Such controller unit comprises a PI-controller with a proportional transfer element and an integrating transfer element arranged parallel to the proportional transfer element. A controller input of the controller unit is connected with both transfer elements.

A transfer function of the PI-controller has a conjugate complex pole at a controller angular frequency $\omega_r$ in the s-plane or a pole at $e^{\pm j\omega_r T}$ in the z-plane, where T is the sampling time of a discrete input signal of the PI-controller and $\omega_r$ is larger than 0.

In a second aspect, the invention provides a device. Such device includes a movably supported oscillator that is excitable to an oscillation with the resonance angular frequency $\omega_0$ along a direction of excitation and a controller unit comprising a PI-controller with a proportional transfer element and an integrating transfer element arranged parallel to the proportional transfer element where a controller input of the controller unit is connected with both transfer elements.

An integral action coefficient of the integrating transfer element and an amplification factor of the proportional transfer element are chosen so that the PI-controller is suitable for generating, at admission with a harmonic input signal of the controller angular frequency $\omega_r$ modulated by the step function at the controller input, a harmonic oscillation of the controller angular frequency $\omega_r$ with rising amplitude at the controller output. The controller angular frequency $\omega_r$ is equal to the resonance angular frequency $\omega_0$.

In a third aspect, the invention provides a rotation rate sensor. The sensor includes a movably supported oscillator that is excitable in a direction of excitation to an oscillation with resonance angular frequency $\omega_0$, and a controller unit comprising a PI-controller with a proportional transfer element and an integrating transfer element arranged parallel to the proportional transfer element controller input of the controller unit is connected with both transfer elements.

The transfer function of the PI-controller has a conjugate complex pole at the resonance angular frequency $\omega_0$ in the s-plane or at $e^{\pm j\omega_0 T}$ in the z-plane, where T is the sampling time of a discrete input signal of the PI-controller (225, 325) and $\omega_0$ is larger than 0.

In a fourth aspect, the invention provides a method for operating a rotation rate sensor. Such method includes the steps of generating a measurement signal by a sensor reproducing a deflection of an oscillator and generating a controller signal for an actuator from the measurement signal, wherein the actuator counteracts the deviation of the oscillator from a harmonic oscillation with the resonance angular frequency $\omega_0$. The controller signal is derived by means of a controller unit from the measurement signal. The controller unit comprises a PI-controller with a proportional transfer element and an integrating transfer element, arranged parallel to the proportional transfer element. A controller input of the controller unit is connected with both transfer elements.

A transfer function of the PI-controller has a conjugate complex pole at the resonance angular frequency $\omega_0$ in the s-plane or a pole at $e^{\pm j\omega_0 T}$ in the z-plane, where T is the sampling time of a discrete input signal of the PI-controller.

In a fifth aspect, the invention provides a method for manufacturing a rotation rate sensor. The method consists of dimensioning a controller unit comprising a PI-controller with a proportional transfer element and an integrating transfer element arranged parallel to the proportional transfer element where a controller input of the controller unit is connected with both transfer elements. The PI-controller is provided with a transfer function that has a conjugate complex pole at a controller angular frequency $\omega_r$ in the s-plane or a pole at $e^{\pm j\omega_r T}$ in the z-plane, where T is the sampling time of a discrete input signal of the PI-controller and $\omega_r$ is larger than 0. An integral action coefficient of the integrating transfer element and an amplification factor of the proportional transfer element are chosen so that the PI-controller is suitable for generating at admission with a harmonic input signal of controller angular frequency $\omega_r$ modulated by the step function at the controller input. A harmonic oscillation of the controller angular frequency $\omega_r$ with rising amplitude at the controller output. The controller angular frequency $\omega_r$ is chosen so that the controller angular frequency $\omega_r$ is equal to the resonance angular frequency $\omega_0$ of an excitation unit of the rotation rate sensor.

The preceding and other features of the invention will become further apparent from the detailed description that follows. Such written description is accompanied by a set of drawing figures in which numerals, corresponding to numerals of the written description, point to the features of the invention. Like numerals point to like features of the invention throughout both the written description and the drawing figures.

DETAILED DESCRIPTION OF THE PREFERRED EMBODIMENT

Figure 1A:
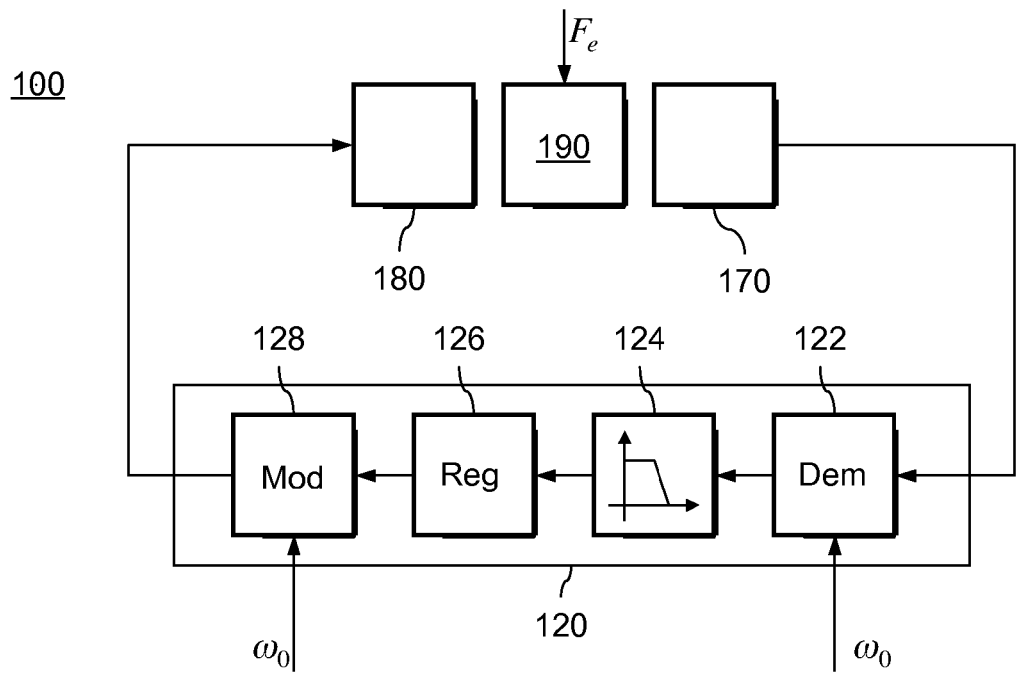
FIG. 1A is a schematic block diagram of a device with a harmonically excited oscillator and a controller unit for resetting the deflection of the oscillator in accordance with the prior art.
Figure 1B:
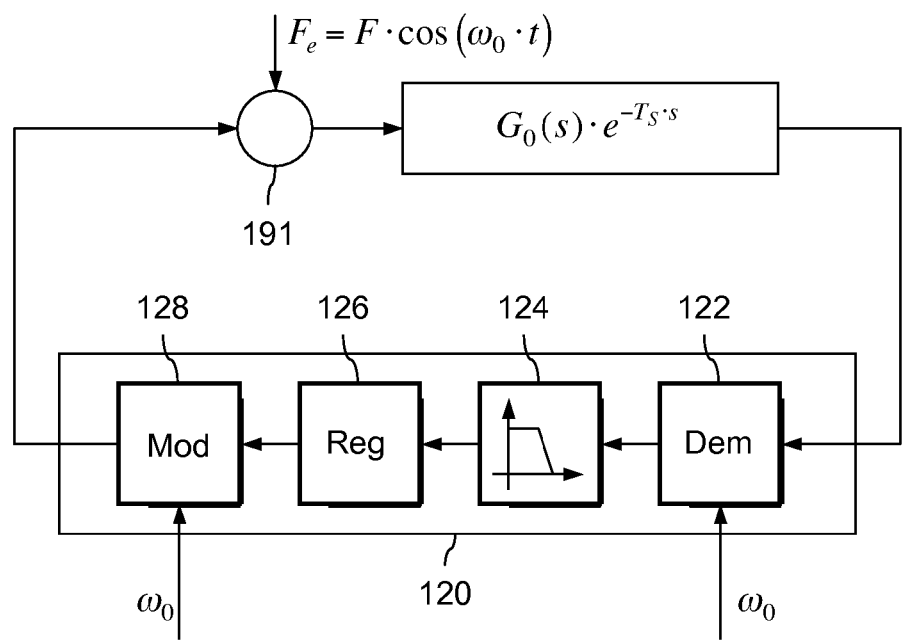
FIG. 1B is a schematic model of the device of FIG. 1A.
Figure 1C:
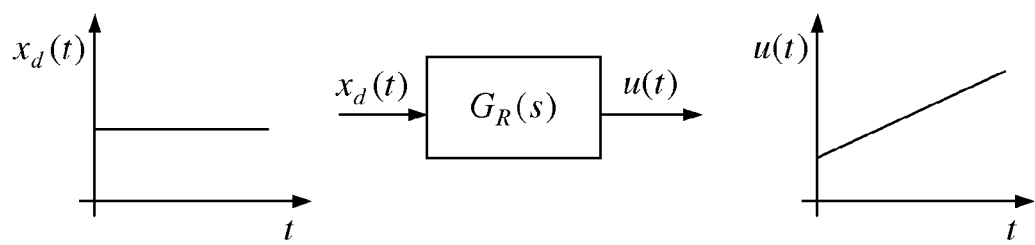
FIG. 1C illustrates the transfer function of a continuous PI-controller operated at baseband.
Figure 1D:
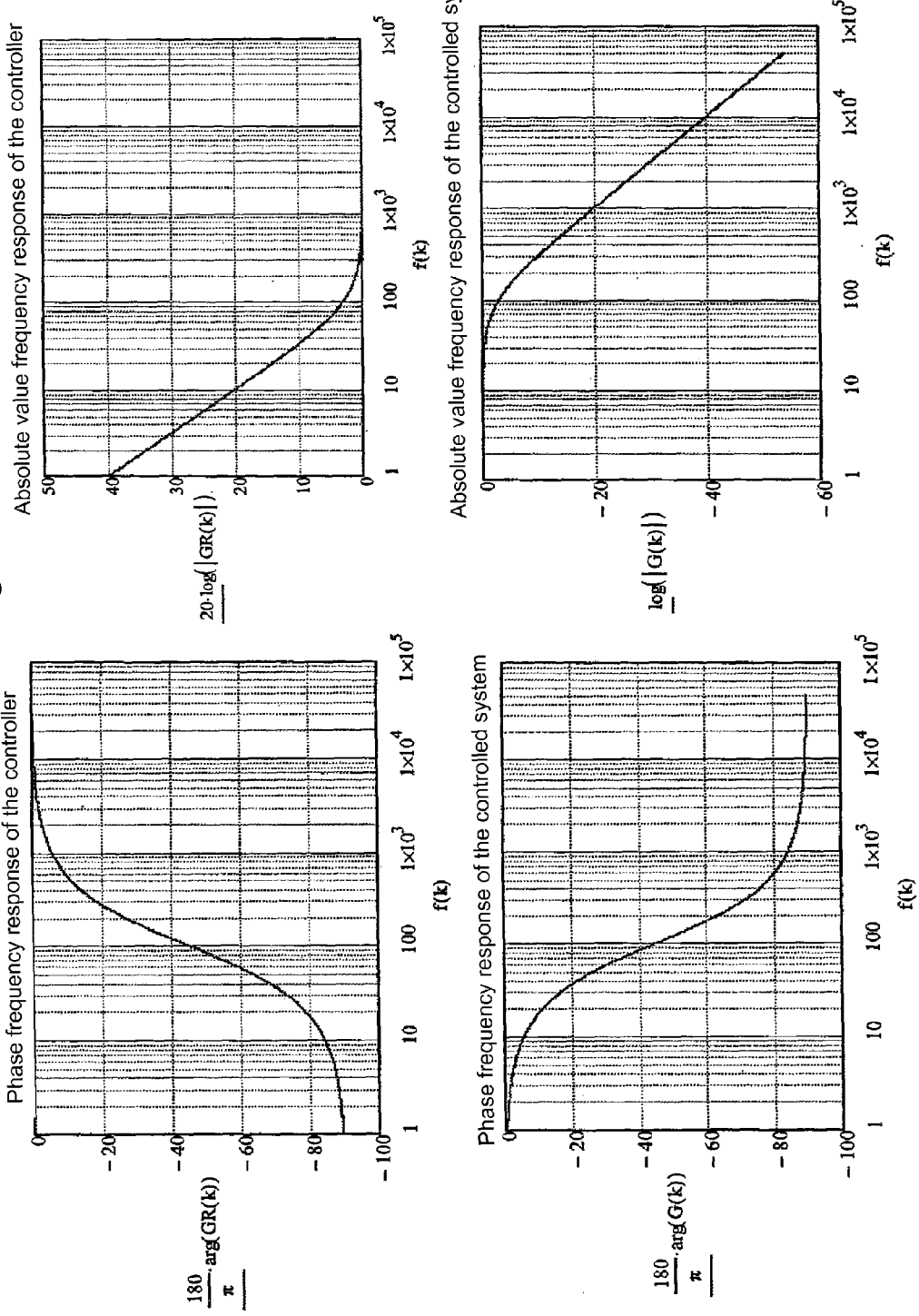
FIG. 1D comprises multiple frequency response diagrams for a continuous PI-controller for illustration of the operation of controller units in accordance with the prior art.
Figure 1D:
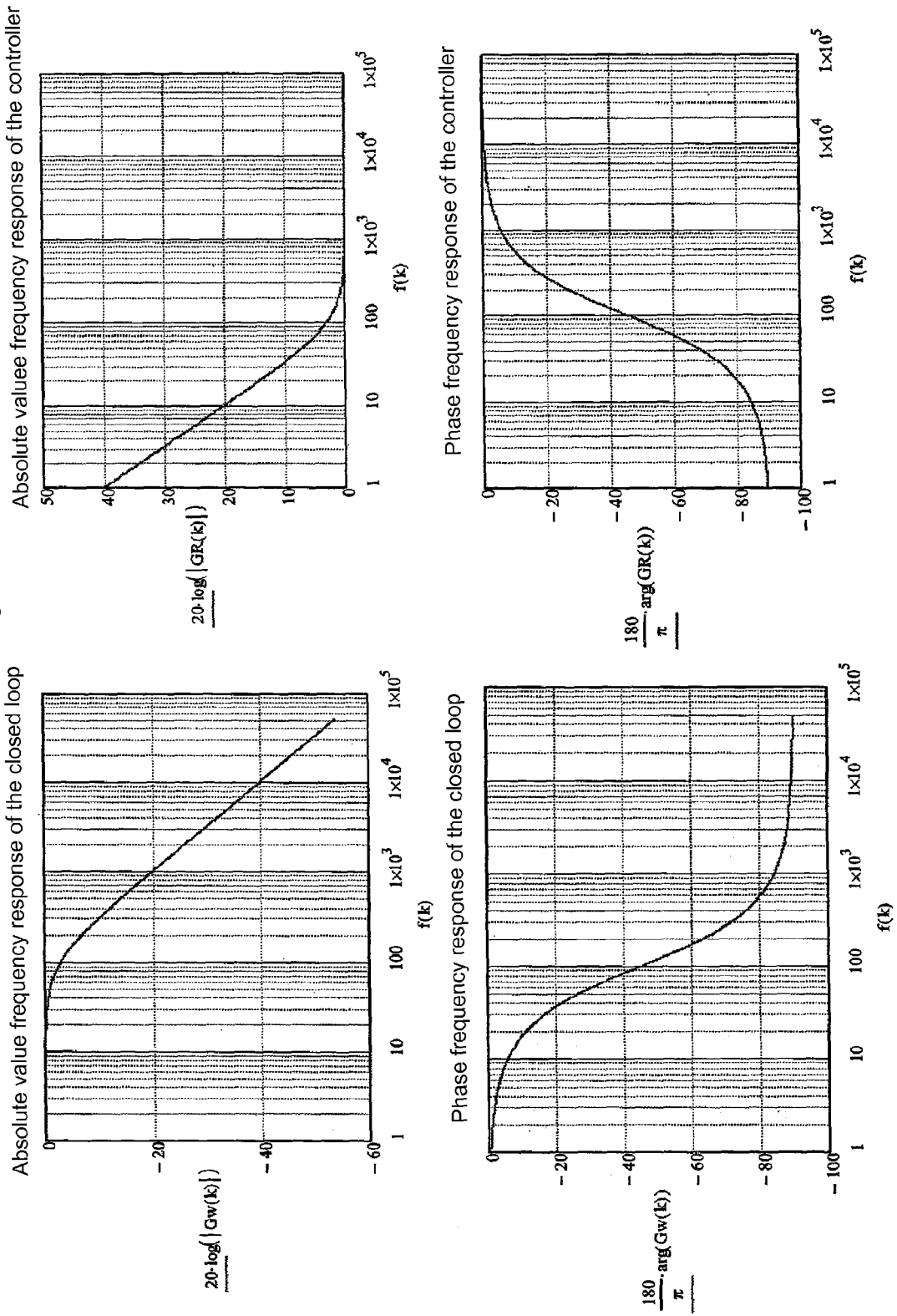
Figure 2A:
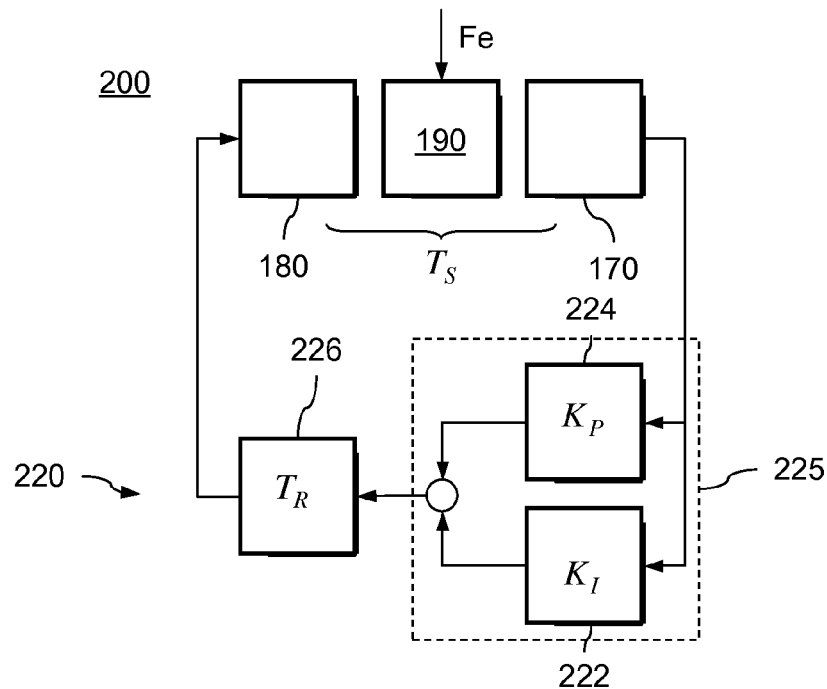
FIG. 2A is a schematic block diagram of a device with a controller unit according to one embodiment of the invention that refers to a controller unit with a continuous PI-controller for harmonic command variables and a dead time element.
Figure 2B:
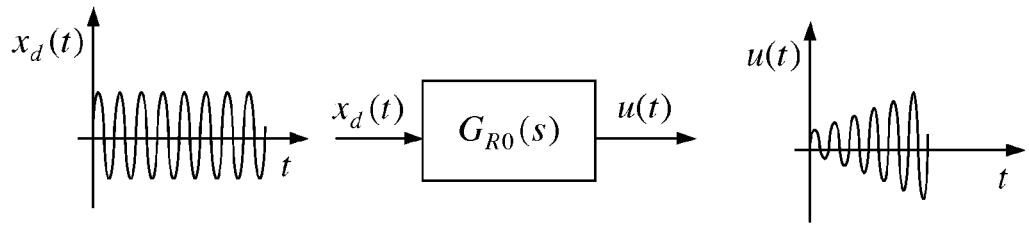
FIG. 2B is a schematic illustration of the transfer function of the PI-controller of FIG. 2A.

Turning to the drawings, FIG. 2A illustrates a device 200 with a control unit 220 which includes a PI-controller 225 for harmonic command variables with an integrating transfer element 222 with an integral action coefficient $K_i$ and a proportional transfer element 224 with an amplification factor $K_p$. The PI-controller 225 for harmonic command variables generates a harmonic oscillation with the same frequency and time proportional amplitude at the controller output from a harmonic oscillation of constant amplitude at the controller input, which is amplitude modulated with the step function. FIG. 2B illustrates the transformation of a sine wave modulated step function signal $x_d(t)$ into a harmonic output signal $u(t)$ with time proportional amplitude by the transfer function $G_{R0}(s)$ of the PI-controller 225. The described behavior of the PI-controller requires dimensioning of the controller parameters $K_i$, $K_p$ as described below.

Analogous to equation (3), equation (9) below describes the relation between the controller output signal $u(t)$ and the controller input signal $x_d(t)$ for $x_d(t)=\sigma(t)$:

$$u(t)=(K_P+K_I \cdot t)\cdot \sin(\omega_0 \cdot t)\cdot \sigma(t). \quad (9)$$

The Laplace-transform of the controller output signal $u(t)$ and controller input signal $x_d(t)$ are derived as in equations (9a) and (9b) below:

$$X_d(s) = \frac{\omega_0}{s^2 + \omega_0^2} \quad (9a)$$

$$U(s) = K_P \cdot \frac{\omega_0}{s^2 + \omega_0^2} + K_I \cdot \frac{2 \cdot \omega_0 \cdot s}{(s^2 + \omega_0^2)^2}. \quad (9b)$$

The transfer function $G_{R0}(s)$ of the PI-controller 225 for harmonic command variables follows as in equation (10) below:

$$G_{R0}(s) = \frac{U(s)}{X_d(s)} = K_P \cdot \frac{s^2 + 2 \cdot \frac{K_I}{K_P} \cdot s + \omega_0^2}{s^2 + \omega_0^2} \quad (10)$$

A conjugate complex pole at $s=\pm j\omega_0$ resulting from the generalized integral component is characteristic of the continuous PI-controller 225. With an harmonic oscillation of frequency $\omega_0$ at the controller input, the PI-controller 225 generates no phase shift at the controller output. For adjusting an arbitrary phase, the controller unit 220 therefore additionally includes a dead time element 226 with controller dead time $T_R$ in series with the PI-controller 225. The transfer function $G_R(s)$ of the controller unit 220 thus follows from equation (11) below:

$$G_R(s) = G_{R0}(s) \cdot e^{-T_R \cdot s} = K_P \frac{s^2 + 2 \cdot \frac{K_I}{K_P} \cdot s + \omega_0^2}{s^2 + \omega_0^2} \cdot e^{-T_R \cdot s} \quad (11)$$

The controller parameters $K_I$, $K_P$ are chosen so that the controller zeros of the controller transfer functions according to equation (11) compensate the conjugate complex system pole in the system transfer functions according to equation (1). Equations (12a) and (12b) result from equating the coefficients of equations (1) and (11) for determination of the controller parameters $K_I$, $K_P$:

$$2 \cdot \frac{K_I}{K_P} \stackrel{!}{=} 2 \cdot s_0 \quad (12a)$$

$$\omega_0^2 \stackrel{!}{=} \omega_0^2 + s_0^2. \quad (12b)$$

According to one embodiment, the damping $s_0$ and the resonance angular frequency $\omega_0$ of the oscillator 190 are chosen so that $s_0 \ll \omega_0$ is satisfied and that, hence, equation (12b) is satisfied in very good approximation. Equation (12c) results from equation (12a) as a dimensioning rule for the ratio of the integral action coefficient $K_I$ to the amplification factor $K_P$:

$$\frac{K_I}{K_P} \stackrel{!}{=} s_0. \quad (12c)$$

The transfer function $G_k(s)$ of the corrected open loop results from the product of the system transfer function $G_S(s)$ and the controller transfer function $G_R(s)$. As the expression for the conjugate complex system pole and the conjugate complex controller zeros cancel by appropriate dimensioning according to equations (12b), (12c), the transfer function $G_k(s)$ of the corrected open loop results as equation (13):

$$G_k(s) = G_S(s) \cdot G_R(s) = A \cdot K_P \cdot \frac{1}{s^2 + \omega_0^2} \cdot e^{-(T_S + T_R)s} \quad (13)$$

By feedback control with a conventional PI-controller, a jump from +90° to −90° occurs in the phase frequency response of the corrected open loop at the frequency ω=0. In contrast, a 180° phase jump occurs at the frequency $\omega_0$ in the PI-controller 225 designed for harmonic command variables (not necessarily between +90° and −90°). According to one embodiment, the controller dead time $T_R$ is therefore chosen so that the 180° phase jump occurs as close as possible to $\omega_0$, for example by dimensioning the controller parameters according to equation (14a) below:

$$(T_S + T_R) \cdot \omega_0 = \frac{3}{2} \cdot \pi \quad (14a)$$

If the phase shift produced by the system dead time $T_S$ alone at $\omega_0$ is less than 90°, then the phase ratio of 180° can also be generated by an inverting controller. In this case the phases produced by the controller dead time $T_R$ and the system dead time $T_S$ at $\omega_0$, respectively, must merely add to π/2. The dimensioning rule for the controller dead time $T_R$ is then:

$$(T_S + T_R) \cdot \omega_0 = \frac{\pi}{2}. \quad (14b)$$

The stability properties of the closed loop can be deduced via the Nyquist criterion from the frequency response of the corrected open loop. The corrected open loop consists of the generalized integrator and the combination of system dead time $T_S$ and controller dead time $T_R$. By appropriate dimensioning of the controller dead time $T_R$ according to equations (14a) or (14b), the phase characteristics at the frequency $\omega_0$ has a 180° jump between +90° for lower frequencies ω<$\omega_0$ to −90° to higher frequencies ω>$\omega_0$. The transfer function $G_w(s)$ of the closed loop is related to that of the corrected open loop $G_k(s)$, again, according to equation (8).

$$G_w(s) = \frac{G_k(s)}{1 + G_k(s)}. \quad (15)$$

When the controller dead time $T_R$ is determined according to equation (14a) the closed loop is exactly stable when the locus of the corrected open loop neither encloses nor runs through the point −1 for 0≤ω<$\omega_0$. In contrast, when the controller dead time $T_R$ is determined according to equation (14b) and the PI-controller 225 generates a 180° phase then the closed loop is exactly stable when the locus of the corrected open loop at a negative real axis starts at a value larger than −1.

In the interval 0≤ω<$\omega_0$ the absolute value characteristic intersects the 0 dB line at the gain crossover frequency where the frequency difference from $\omega_0$ at the gain crossover frequency determines the bandwidth of the closed loop. The absolute value frequency response and, hence, the gain crossover frequency can be shifted by the amplification factor $K_P$ along the ordinate so that the resulting bandwidth of the closed loop is adjustable. According to one embodiment, the amplification factor $K_P$ is chosen so that the bandwidth is maximal within the limits given by the stability criteria.

Figure 2C:
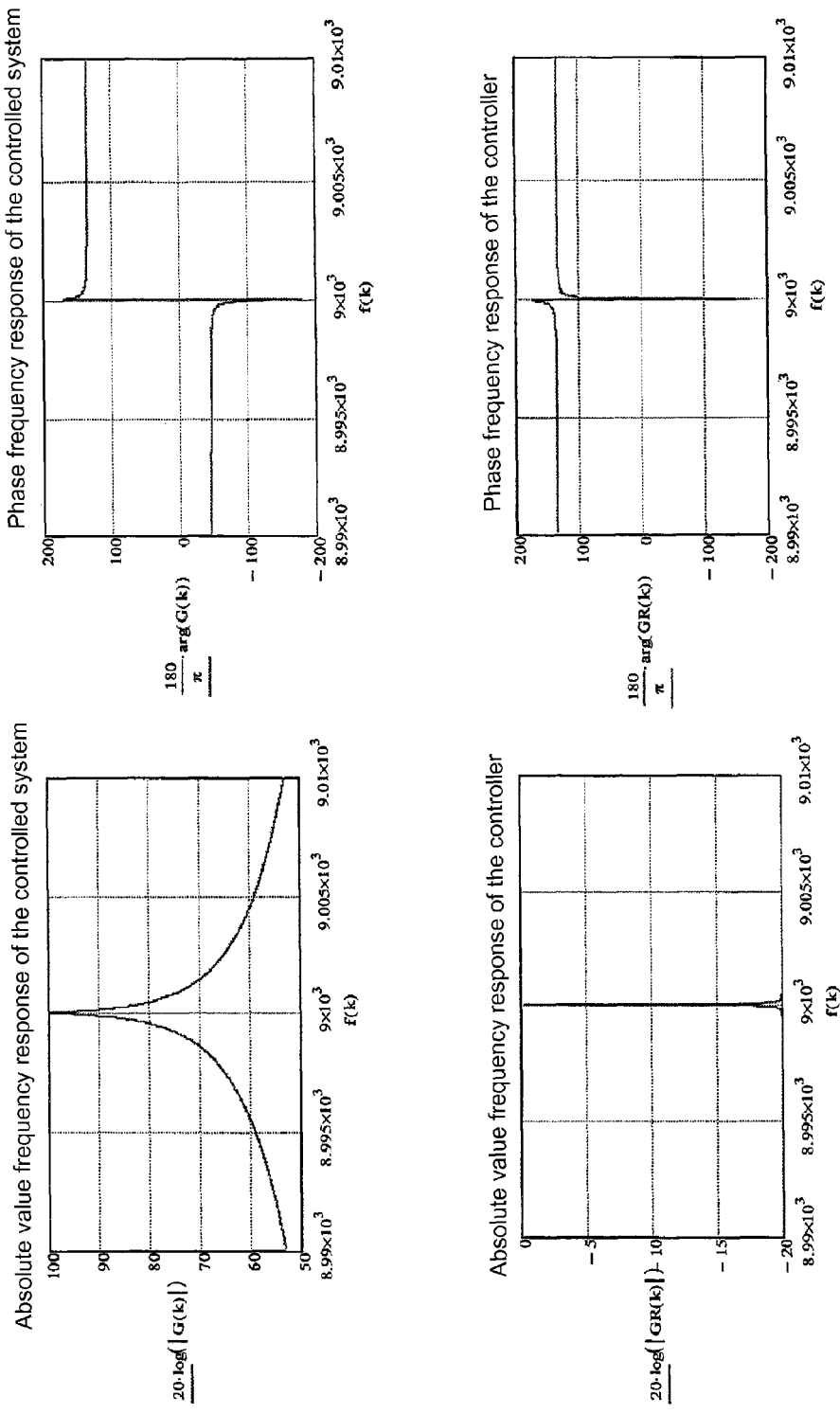
FIG. 2C comprises multiple diagrams for illustrating frequency response for the controller unit illustrated in FIG. 2A.
Figure 2C:
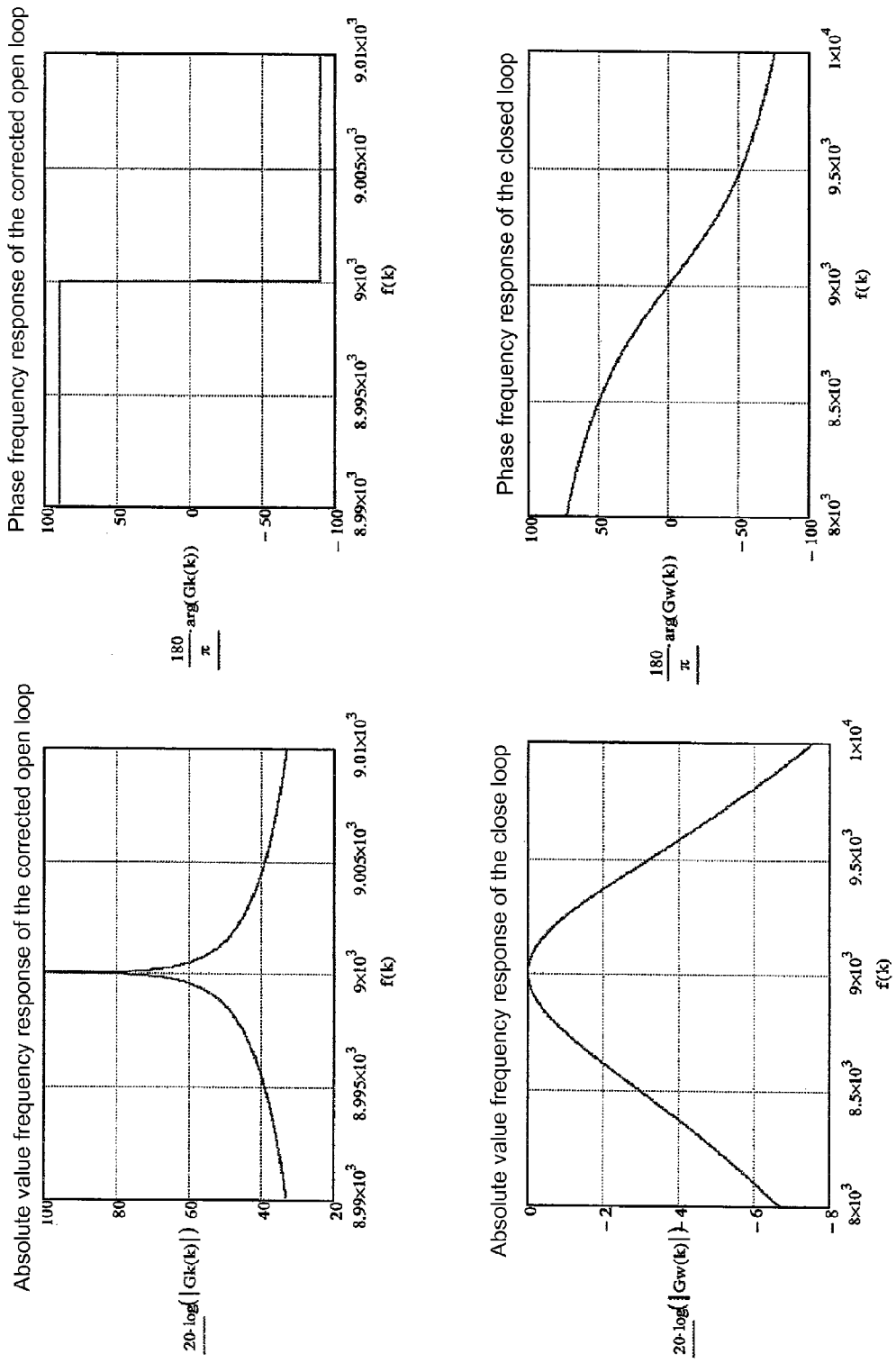

The graphs of the left hand column (from top to bottom) of FIG. 2c illustrates the absolute value frequency responses for the controlled system, the controller, the corrected open loop and the closed loop while those of the right column illustrate phase frequency responses for the controlled system, the controller, the corrected open loop and the closed loop for an embodiment having system parameters as follows: resonance angular frequency of the oscillator $\omega_0=2\cdot\pi\cdot9000$ Hz; damping of the oscillator $$s_0 = \frac{\omega_0}{200000};$$

amplification $A=s_0^2+\omega_0^2$; and system dead time $$T_s = \frac{\pi}{4\cdot\omega_0}.$$

The controller zero is chosen so that the system pole is compensated. As the phase (at $\omega_0$) which is produced by the system dead time is smaller than 90°, the phase ratio of 180° can be realized by a minus sign in the controller (inverting controller). For an amplification factor $K_P=-1/10$ the integral action coefficient $K_I$ results from equation (12c) and the controller dead time $T_R$ results from equation (14b) as $T_R=\pi/4\cdot\omega_0$.

The resulting bandwidth of the closed loop amounts to approximately 500 Hz and is clearly larger than in the comparative example of a conventional PI-controller operated in the baseband.

The device of FIG. 2A includes an oscillator 190 and a controller unit 220. The oscillator 190 is a mass movable along a direction of excitation that is capable of oscillating with a resonance angular frequency $\omega_0$. In the stationary case (e.g. without admission with a disturbance) the oscillator 190 undergoes a translational or rotational oscillation with the resonance angular frequency $\omega_0$. A deflection effected by a force amplitude is superposed to this oscillation. A sensor 170 captures the movement of the oscillator 190 and outputs a measurement signal, which reproduces the entire deflection of the oscillator 190 along the direction of excitation. The measurement signal corresponds to a controller input signal for the controller unit 220. The controller unit 220 generates a controller output signal from the controller input signal and outputs the controller output signal to an actuator 180. The actuator 180 counteracts the deflection effected by the force signal F of the oscillator 190 and compensates the deflection such that the oscillator 190 performs a harmonic oscillation with constant amplitude at the resonance angular frequency $\omega_0$.

The controller unit 220 has a PI-controller 225, which includes a proportional transfer element 224 with an amplification factor $K_P$ and a integrating transfer element 222 with an integral action coefficient $K_I$, for harmonic command variables. The integral action coefficient $K_I$ and the amplification factor $K_P$ are chosen so that the zero of the controller transfer function of the PI-controller 225 and the conjugate complex pole of the system transfer function, which describes the oscillator 190, compensate in the s-plane.

According to one embodiment, the damping $s_0$ of the oscillator 190 with respect to deflection in the direction of excitation is much smaller than the resonance angular frequency $\omega_0$ of the oscillator 190 and the ratio of the integral action coefficient $K_I$ to the amplification factor $K_P$ in sec$^{-1}$ corresponds approximately to the damping $s_0$. Moreover, the amplification factor $K_P$ can be chosen so that the resulting bandwidth is as high as possible for respective stability requirements. The integral action coefficient $K_I$ is then chosen in relation to the damping $s_0$ and the amplification factor $K_P$ according to equation (12c).

According to one embodiment, the system formed from the actuator 180, the oscillator 190 and the sensor 170 has a dead time $T_S$ and the controller unit 220 has a dead time element 226 with the controller dead time $T_R$ acting serially to the PI-controller 225. The controller dead time $T_R$ is chosen in relation to the resonance frequency $\omega_0$ of the oscillator 290 and the system dead time $T_S$ is chosen so that the phase frequency response of the corrected open loop at the frequency $\omega_0$ has a phase jump from +90° to −90° towards higher frequencies.

According to a first variant of this embodiment, the PI-controller for harmonic command variables does not flip the sign and the controller dead time $T_R$ is chosen so that the product of the resonance angular frequency $\omega_0$ and the sum of system dead time $T_S$ and controller dead time $T_R$ is $3\pi/2$. According to another variant of this embodiment, the PI-controller 225 inverts the sign, shifts the phase about 180°, and the phase effected by the controller dead time $T_R$ and the system dead time $T_S$ at the resonance angular frequency $\omega_0$ merely adds to $\pi/2$ so that the product of the resonance angular frequency $\omega_0$ and the sum of system dead time $T_S$ and controller dead time $T_R$ is $\pi/2$.

As the controller unit 220 provides no baseband transformation (which requires a low pass filter for damping higher frequency conversion products), the controller 220 can be formed with a considerable broader band. The controller unit 220 reacts faster to disturbances than comparative controllers that provide a baseband transformation.

FIGS. 3A to 3E refer to an embodiment in which the controller 220 has a discrete PI-controller 325 for harmonic command variables with a discrete proportional transfer element 324 of amplification factor $K_P$ and a discrete integrating transfer element 322 with integral action coefficient $K_I$. According to one embodiment an analog measurement signal from the sensor 170, is sampled by a sampling unit 321 with a sampling time T and transformed into a digital input signal for the discrete PI-controller 325. According to another embodiment the sensor 170 already outputs a digital measurement signal.

According to an embodiment in which the system including the actuator 180, the oscillator 190 and the sensor 170 has a system dead time $T_S$, the controller unit 220 includes a dead time element 326 arranged in series with the discrete PI-controller 325 with a controller dead time $T_R$. The system dead time $T_S$ as well as the controller dead time $T_R$ are expressed as multiples of the sampling time T according to equations (16a) and (16b) below:

$$T_S=\beta_S\cdot T \text{ and} \tag{16a}$$

$$T_R\beta_D\cdot T. \tag{16b}$$

In this process, the controller dead time $T_R$ is determined so that the corrected open loop has a phase jump at the resonance angular frequency $\omega_0$ from +90° and −90° towards higher frequencies.

According to one embodiment, the ratio of the integral action coefficient $K_I$ to the amplification factor $K_P$ is adjusted so that the controller zero of the controller transfer function compensates the conjugate complex system pole of the system transfer function in the s-plane. According to another embodiment, controller parameters are chosen so that the transfer function of the closed loop of an equivalent baseband system has a double real eigenvalue. The controller unit 220 is, for example, realized as a digital circuit (e.g., as ASIC (application specific integrated circuit), DSP (digital signal processor) or FPGA (Field Programmable Gate Array)).

Figure 3A:
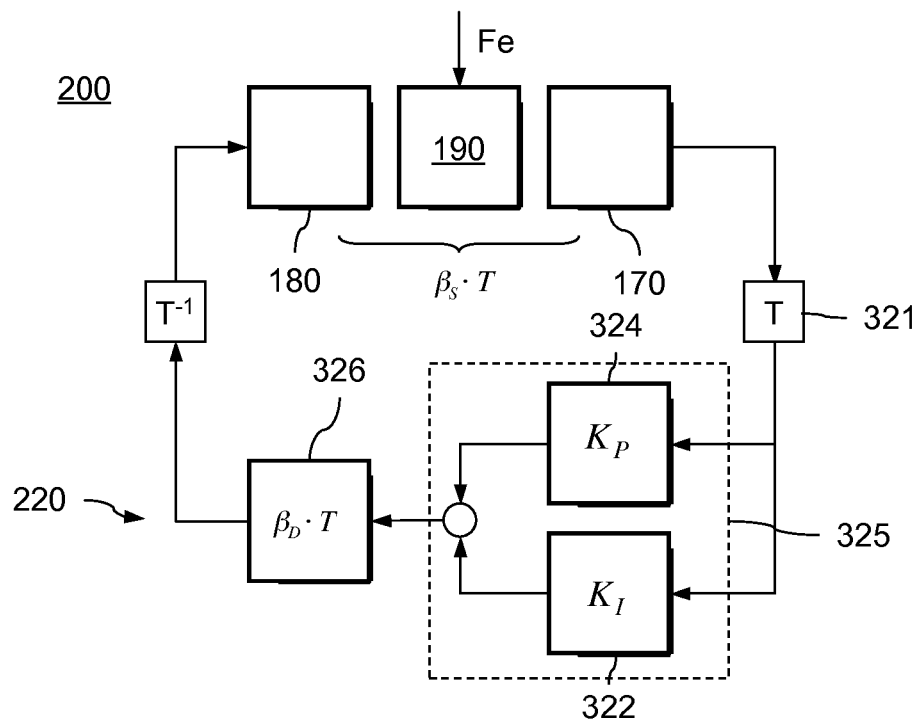
FIG. 3A is a schematic block diagram of a device with a controller unit according to another embodiment of the invention that refers to a controller unit with a discrete PI-controller for harmonic command variables and a dead time element.
Figure 3B:
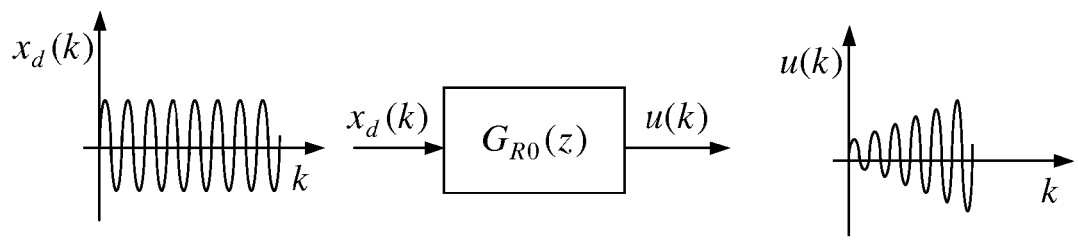
FIG. 3B schematically illustrates the transfer function of the controller unit of FIG. 3A.

FIG. 3B illustrates the z-transfer function $G_{R0}(z)$ of the discrete PI-controller 325 for harmonic command variables according to FIG. 3A. The transfer function $G_{R0}(z)$ is determined so that the PI-controller 325 generates, from an input signal $x_d(k)$ including a harmonic oscillation modulated with the step function $\sigma(k)$, a harmonic oscillation of the same frequency with a time proportional amplitude as the controller output signal u(k), defined by equation (17) below:

$$u(k) = (K_P + K_I \cdot T \cdot k) \cdot \sin(\omega_0 \cdot T \cdot k) \cdot \sigma(k) \tag{17}$$

The input function $X_d(z)$ and the output function U(z) result from z-transformations according to equations (18a) and (18b) below:

$$X_d(z) = \frac{z \cdot \sin(\omega_0 \cdot T)}{z^2 - 2 \cdot \cos(\omega_0 \cdot T) \cdot z + 1} \tag{18a}$$

$$U(z) = K_P \cdot \frac{z \cdot \sin(\omega_0 \cdot T)}{z^2 - 2 \cdot \cos(\omega_0 \cdot T) \cdot z + 1} + K_I \cdot \frac{T \cdot z^3 \cdot \sin(\omega_0 \cdot T) - T \cdot z \cdot \sin(\omega_0 \cdot T)}{(z^2 - 2 \cdot \cos(\omega_0 \cdot T) \cdot z + 1)^2} \tag{18b}$$

The transfer function $G_{R0}(z)$ of the discrete PI-controller 325 for harmonic command variables is then, according to equation (18c) below:

$$G_{R0}(z) = \frac{U(z)}{X_d(z)} = \frac{(K_P + K_I \cdot T) \cdot z^2 - 2 \cdot K_P \cdot \cos(\omega_0 \cdot T) \cdot z + K_P - K_I \cdot T}{z^2 - 2 \cdot \cos(\omega_0 \cdot T) \cdot z + 1} \tag{18c}$$

As the generalized integral portion, such a discrete PI-controller has a pole at $z = e^{\pm j\omega_0 T}$ and generates, with a harmonic oscillation of the frequency $\omega_0$ at the input, no phase shift at the output. To be able, nevertheless, to adjust an arbitrary phase, the controller unit 220 is provided with a dead time element 326 of retardation $\beta_D$ according to one embodiment. The controller transfer function $G_R(z)$ of the controller unit 220 with the dead time element 326 and the discrete PI-controller 325 is derived as equation (19) below:

$$G_R(z) = G_{R0}(z) \cdot z^{-\beta_D} = \frac{(K_P + K_I \cdot T) \cdot z^2 - 2 \cdot K_P \cdot \cos(\omega_0 \cdot T) \cdot z + K_P - K_I \cdot T}{z^2 - 2 \cdot \cos(\omega_0 \cdot T) \cdot z + 1} \cdot z^{-\beta_D} \tag{19}$$

The model of the continuous controlled system according to equation (1) has to be discretized accordingly. To this end in the transfer function G(s) of the controlled system according to equation (1) the system dead time $T_S$ is at first expressed as a multiple of the sampling time T according to equation (16a):

$$G(s) = \frac{A}{(s + s_0)^2 + \omega_0^2} \cdot e^{-\beta_S T_s} = G_0(s) \cdot e^{-\beta_S T_s} \tag{20}$$

Generally a step transfer function G(z) of a discretized model of a continuous controlled system with the transfer function G(s) can be calculated according to equation (21):

$$G(z) = \frac{z-1}{z} \cdot Z\left\{\frac{G(s)}{s}\right\} \tag{21}$$

Employing the following abbreviations according to equations (21a) to (21e)

$$K_S = \frac{A}{s_0^2 + \omega_0^2} \tag{21a}$$

$$b_1 = 1 - e^{-s_0 \cdot T} \cdot \cos(\omega_0 \cdot T) - \frac{s_0}{\omega_0} \cdot e^{-s_0 \cdot T} \cdot \sin(\omega_0 \cdot T) \tag{21b}$$

$$b_2 = e^{-2s_0 \cdot T} - e^{-s_0 \cdot T} \cdot \cos(\omega_0 \cdot T) + \frac{s_0}{\omega_0} \cdot e^{-s_0 \cdot T} \cdot \sin(\omega_0 \cdot T) \tag{21c}$$

$$a_1 = 2 \cdot e^{-s_0 \cdot T} \cdot \cos(\omega_0 \cdot T) \tag{21d}$$

$$a_2 = -e^{-2s_0 \cdot T} \tag{21e}$$

the step transfer function G(z) for the oscillator 190 resulting from equations (20) and (21) is, according to equation (22):

$$G(z) = K_s \cdot \frac{b_1 z + b_2}{z^2 - a_1 \cdot z - a_2} \cdot \frac{1}{z^{\beta_S}} = G_0(z) \cdot \frac{1}{z^{\beta_S}} \tag{22}$$

In one embodiment of the invention, the controller dead time $T_R$ is determined so that the phase frequency response of the compensated open loop has a phase jump from $+90°$ to $-90°$ towards higher frequencies at the resonance angular frequency $\omega_0$. The z-transfer function for the compensated open loop results in analogy to equation (13) from the multiplication of the system transfer function G(z) according to equation (20) with the controller transfer function $G_R(z)$ according to equation (19):

$$G_K(z) = G_0(z) \cdot G_{R0}(z) \cdot z^{-((\beta_S + \beta_D))} \tag{23}$$

Analogous to the equations (14a) and (14b), the controller parameter $\beta_D$ is chosen such that the transfer function of the corrected open loop $G_K(z)$ has a phase jump from $+90°$ to $-90°$ at the resonance angular frequency $\omega_0$:

$$\left(\beta_S + \beta_D + \frac{1}{2}\right) \cdot \omega_0 \cdot T = \frac{3}{2} \cdot \pi \tag{24a}$$

In comparison to equation (14a) one finds an additional part of $\frac{1}{2}\omega_0 T$ with respect to the continuous controller, which represents a retardation that can be traced back to the discretizing of an additional half sampling cycle. As in the case of the continuous controller, a phase jump of 180° can be generated by a minus sign in the controller, provided that the phase shift generated by the system dead time $\beta_S \cdot T$ and the discretization, respectively, are smaller than 90° at the resonance angular frequency $\omega_0$ so that the phases generated by the discretization, the controller dead time $\beta_D \cdot T$ and the system dead time $\beta_S \cdot T$, need only add up to $\pi/2$. Accordingly, the dimensioning rule for $\beta_D$ results in this case in equation (24b):

$$\left(\beta_S + \beta_D + \frac{1}{2}\right) \cdot \omega_0 \cdot T = \frac{\pi}{2}. \tag{24b}$$

The equations (24a) and (24b) normally lead to a non-integral value for $\beta_D$. Generally, the controller parameter $\beta_D$ has an integral part $n_D$ and a remainder $1/a_D$ with $a_D > 1$ according to equation (25):

$$\beta_D = n_D + \frac{1}{a_D} \tag{25}$$

According to one embodiment, the integral part $n_D$ can be approximated by a retardation chain in accordance with the length denoted by $n_D$ and the fraction $1/a_D$ of a sampling cycle can be approximated by an all-pass filter of first order according to equation (26):

$$z^{-\frac{1}{a_D}} \approx \frac{\alpha_D \cdot z + 1}{z + \alpha_D}. \tag{26}$$

According to one embodiment, the parameter $\alpha_D$ of the all-pass filter is chosen such that the phase of the exact transfer function $z^{-\alpha_D^{-1}}$ and the phase of the all-pass approximation according to equation (26) coincide at the resonance angular frequency $\omega_0$ as far as possible. From these conditions equation (27) results as a conditional equation for the parameter $\alpha_D$ of the all-pass filter:

$$-\frac{\omega_0 \cdot T}{a_D} = \arctan\left(\frac{\alpha_D \cdot \sin(\omega_0 \cdot T)}{\alpha_D \cdot \cos(\omega_0 \cdot T) + 1}\right) - \arctan\left(\frac{\sin(\omega_0 \cdot T)}{\cos(\omega_0 \cdot T) + \alpha_D}\right) \tag{27}$$

According to one embodiment $\alpha_D$ is determined such that, via nested intervals, the zeros of the function according to equation (28) are determined as follows:

$$f(\alpha_D) = \tag{28}$$
$$\arctan\left(\frac{\alpha_D \cdot \sin(\omega_0 \cdot T)}{\alpha_D \cdot \cos(\omega_D \cdot T) + 1}\right) - \arctan\left(\frac{\sin(\omega_0 \cdot T)}{\cos(\omega_D \cdot T) + \alpha_D}\right) + \frac{\omega_0 \cdot T}{a_D}$$

The determination of $n_D$ and $a_D$ according to equations (25) and (28) is independent of the method for determining the further controller parameters $K_P$ and $K_I$.

According to one embodiment of a method for manufacturing a controller unit that includes dimensioning the discrete PI-controller 325 according to FIG. 3A, the amplification factor $K_P$ and the integral action coefficient $K_I$ of the discrete PI-controller 325 are chosen so that the controller zeros in the controller transfer function $G_R(z)$ according to equation (19) compensate the conjugate complex system pole of the system transfer function $G(z)$ according to equation (22). Equating coefficients of equations (19) and (22) with respect to $z^1$ leads to the dimensioning rule of equation (29):

$$K_P \stackrel{!}{=} K_I \cdot T \cdot \frac{e^{-s_0 \cdot T}}{1 - e^{-s_0 \cdot T}} \tag{29}$$

Equating coefficients with respect to $z^0$ provides the dimensioning rule of equation (30):

$$K_P \stackrel{!}{=} K_I \cdot T \cdot \frac{1 + e^{-2 \cdot s_0 \cdot T}}{1 - e^{-2 \cdot s_0 \cdot T}}. \tag{30}$$

According to one embodiment, the damping $s_0$ of the oscillator 190 and the sampling time T are chosen such that $s_0 \cdot T \ll 1$ holds whereby approximations according to (31a) and (31b) are sufficiently precise:

$$e^{-s_0 \cdot T} \approx 1 - s_0 \cdot T \tag{31a}$$

$$e^{-2 \cdot s_0 \cdot T} \approx 1 - 2 \cdot s_0 \cdot T \tag{31b}$$

Making the approximations according to equations (31a) and (31b), the two independent dimensioning rules according to equations (29) and (30) can be approximated by the dimensioning rule below:

$$K_P \stackrel{!}{=} K_I \cdot T \cdot \frac{1 - s_0 \cdot T}{s_0 \cdot T}, \text{ respectively } K_I \cdot T \stackrel{!}{=} K_P \cdot s_0 \cdot T. \tag{32}$$

In one embodiment, the ratio of the integral action coefficient $K_I$ to the amplification factor $K_P$ is set equal (or nearly equal) to the damping $s_0$ of the oscillator. The dimensioning of the discrete PI-controller 325 according to the described method, which includes the compensation of the system pole by the controller zero, leads to a good reference action of the closed loop.

According to another embodiment of a method for manufacturing a controller unit, which includes the dimensioning of a discrete PI-controller 325, the integral action coefficient $K_I$ and the amplification factor $K_P$ are determined by suitable eigenvalue specification for a system formed from the discrete PI-controller 325 and a discrete baseband model of the oscillator 190. For this, a baseband model $G_0'(s)$ equivalent to the oscillation model $G_0(s)$ of equation (1) is at first assumed:

$$G_0'(s) = \frac{A'}{s + s_0} \tag{33}$$

The parameters of the equivalent baseband model according to equation (33) are determined in accordance with equation (34) so that the absolute value of $G_0'(s)$ at $\omega=0$ coincides with the absolute value of $G_0(s)$ at $\omega=\omega_0$:

$$\left|\frac{A'}{s + s_0}\right|_{\omega=0} \stackrel{!}{=} \left|\frac{A}{(s + s_0)^2 + \omega_0^2}\right|_{\omega=\omega_0}. \tag{34}$$

According to one embodiment, the oscillator 190 is realized such that $\omega_0 \gg s_0$ holds and the relation between the parameters A and A' is closely approximated by equation (35):

$$A' = \frac{A}{2 \cdot \omega_0} \tag{35}$$

For the discretization of equivalent baseband model $G_0'(s)$, equation (36) results, by analogy to equation (21)

$$G_0'(z) = \frac{z-1}{z} \cdot Z\left\{\frac{G_0'(s)}{s}\right\} \tag{36}$$

From equations (33) and (36) the equivalent discretized baseband model is derived as follows.

$$G_0'(z) = \frac{A'}{s_0} \cdot \frac{1 - e^{-s_0 \cdot T}}{z - e^{-s_0 \cdot T}} \tag{37}$$

Figure 3C:
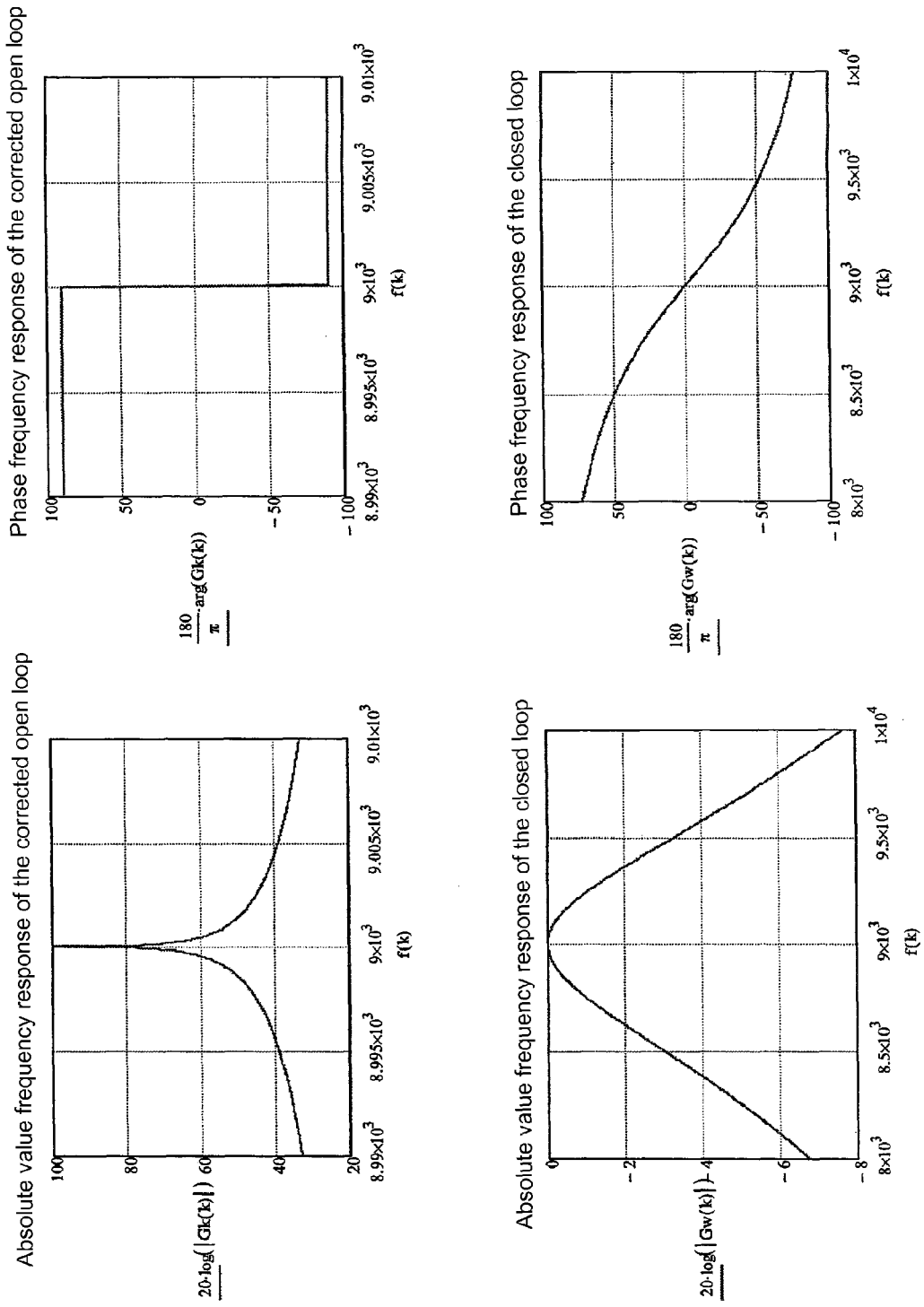
FIG. 3C comprises multiple frequency response graphs for illustrating the operation of the controller unit illustrated in FIG. 3A.
Figure 3D:
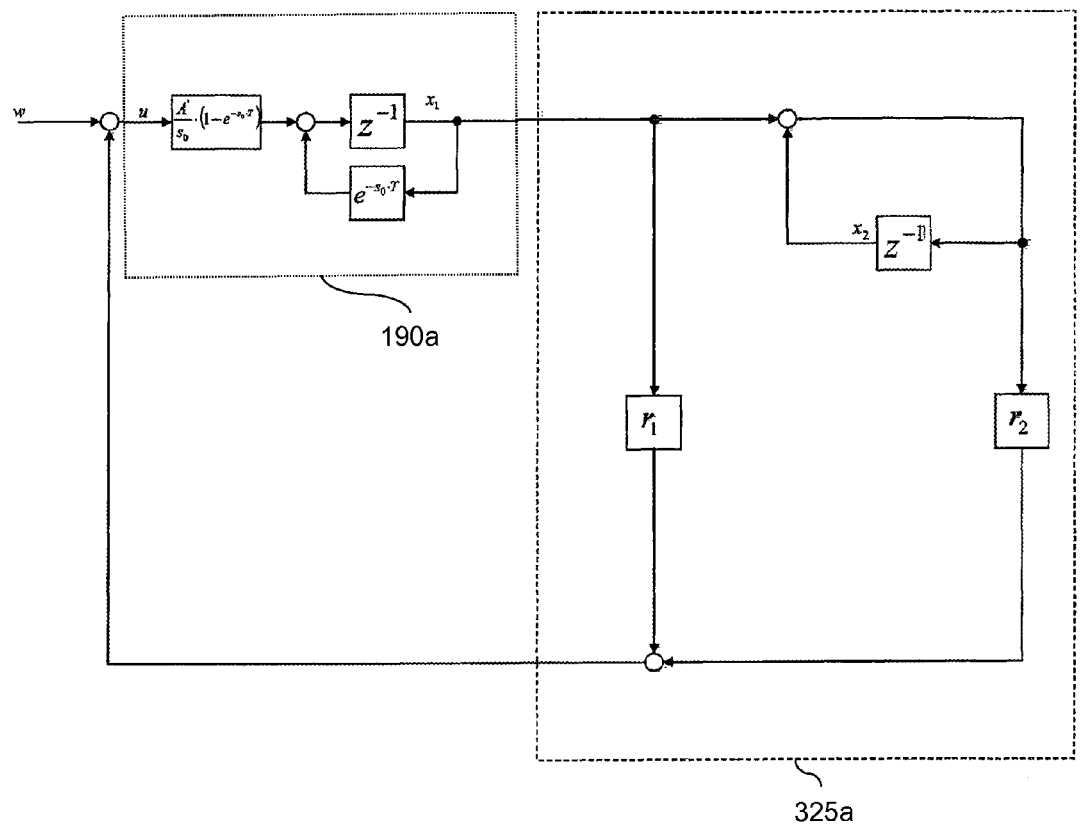
FIG. 3D illustrates a simplified block diagram of the controller unit of FIG. 3A transformed in the baseband according to one embodiment.

FIG. 3D illustrates the discretized baseband model 190a of the oscillator 190 according to equation (37) as well as a controller model 325a of the discrete PI-controller 325 for harmonic command variables according to FIG. 3A with functional subunits. The output of the controller model 325a is fed back to the input of the discretized baseband model 190a. The functional subunits of the controller model 325a can be completely or partially realized by hardware (e.g. by integrated circuits, FPGAs (field programmable gate arrays), ASICs (application specific integrated circuits) or DSPs (digital signal processors)), exclusively realized by software, (implemented, for example, in a DSP or a computer), or realized by a combination of hardware and software.

The system with the discretized baseband model 190a and the controller model 325a illustrated in FIG. 3D can be described by a state model according to equations (38a), (38b):

$$x(k+1) = \begin{bmatrix} e^{-s_0 \cdot T} - (r_1 + r_2) \cdot \frac{A'}{s_0} \cdot (1 - e^{-s_0 \cdot T}) & -r_2 \cdot \frac{A'}{s_0} \cdot (1 - e^{-s_0 \cdot T}) \\ 1 & 1 \end{bmatrix} \cdot \quad (38a)$$

$$x(k+1) + \begin{bmatrix} \frac{A'}{s_0} \cdot (1 - e^{-s_0 \cdot T}) \\ 0 \end{bmatrix} \cdot w(k)$$

$$\underline{x}(k+1) = \underline{\Phi} \cdot \underline{x}(k) + \underline{h} \cdot w(k) \quad (38b)$$

Calculation of the determinant $\det(z \cdot I - \Phi)$ leads to the characteristic polynomial of this system according to equation (39b) below:

$$\det(z \cdot I - \Phi) = \quad (39a)$$

$$\begin{vmatrix} z - e^{-s_0 \cdot T} + (r_1 + r_2) \cdot \frac{A'}{s_0} \cdot (1 - e^{-s_0 \cdot T}) & r_2 \cdot \frac{A'}{s_0} \cdot (1 - e^{-s_0 \cdot T}) \\ -1 & z - 1 \end{vmatrix}$$

$$\det(z \cdot I - \Phi) = z^2 - \left(1 + e^{-s_0 \cdot T} - (r_1 + r_2) \cdot \frac{A'}{s_0} \cdot (1 - e^{-s_0 \cdot T})\right) \cdot z + \quad (39b)$$

$$e^{-s_0 \cdot T} - (r_1 + r_2) \cdot \frac{A'}{s_0} \cdot (1 - e^{-s_0 \cdot T}) + r_2 \cdot \frac{A'}{s_0} \cdot (1 - e^{-s_0 \cdot T})$$

Calculation of the zeros of the characteristic polynomial according to equation (39b) gives the eigenvalues $\lambda_1, \lambda_2$ of the controlled system, for which the characteristic polynomial can be generally described in the form of equation (40):

$$(z - \lambda_1) \cdot (z - \lambda_2) = z^2 - (\lambda_1 + \lambda_2) \cdot z + \lambda_1 \cdot \lambda_2 \quad (40)$$

By equating coefficients between equations (39b) and (40), the controller coefficients depending on the eigenvalues $\lambda_1$ and $\lambda_2$ (which are to be predetermined) result from equations (41a) and (41b) below.

$$1 + e^{-s_0 \cdot T} - (r_1 + r_2) \cdot \frac{A'}{s_0} \cdot (1 - e^{-s_0 \cdot T}) \stackrel{!}{=} \lambda_1 + \lambda_2 \quad (41a)$$

$$e^{-s_0 \cdot T} - (r_1 + r_2) \cdot \frac{A'}{s_0} \cdot (1 - e^{-s_0 \cdot T}) + r_2 \cdot \frac{A'}{s_0} \cdot (1 - e^{s_0 \cdot T}) \stackrel{!}{=} \lambda_1 \cdot \lambda_2 \quad (41b)$$

The equations (41a) and (41b) lead to the equations (42a) and (42b) from which the controller coefficients $r_1$ and $r_2$ of the controller model 325a can be determined from the parameters of the equivalent discrete baseband model and the predetermined eigenvalues:

$$r_1 = \frac{e^{-s_0 \cdot T} - \lambda_1 \cdot \lambda_2}{\frac{A'}{s_0} \cdot (1 - e^{s_0 \cdot T})} \quad (42a)$$

$$r_2 = \frac{(1 - \lambda_1) \cdot (1 - \lambda_2)}{\frac{A'}{s_0} \cdot (1 - e^{-s_0 \cdot T})} \quad (42b)$$

The amplification factor $K_P$ and the integral action coefficient $K_I$ of the controller unit 220 according to FIG. 3A are determined from the controller coefficients $r_1$ and $r_2$ of the controller model 325a of FIG. 3D according to equations (43a) and (43b):

$$K_P = r_1 \quad (43a)$$

$$K_I T = r_2 \quad (43b)$$

According to one embodiment, the eigenvalues $\lambda_1, \lambda_2$ are predetermined without high dynamics requirements so that the transient oscillation process of the baseband system describes, in close approximation, the envelope of the transient oscillation process of the equivalent bandpass system. In this process, the transferability of the baseband design to the bandpass band only holds approximately, due to the controller dead time of the phase adjustment for the bandpass band system acting as an additional dead time with respect to the baseband system that is not taken into account in the controller design. For this reason, when presetting the eigenvalues with excessively high dynamics requirements, the bandpass band system can be unstable, although the equivalent baseband system is stable. However, by referring to the Nyquist stability criterion, the stability of the bandpass band design can be estimated at any time for the predetermined eigenvalues.

When the method for dimensioning a controller provides presetting of eigenvalues, the position of the two eigenvalues with respect to each other is also predetermined. In contrast, a strong deviation of the two eigenvalues from one other can happen at the dimensioning of the PI-controller for harmonic command variables by pole/zero compensation so that the cancelled system pole remains as eigenvalue in the closed loop and leads to a large time constant at a typically low damping of the oscillator. Indeed the "cancelled" eigenvalue has no influence on the response, but it can be excited by perturbations and can result in long, persistent fading processes. In contrast, the design via eigenvalue presetting allows the presetting of both eigenvalues at approximately the same order of magnitude and thus a positive influence of the perturbation behavior. According to one embodiment, the two eigenvalues are set equal or approximately equal with a maximum deviation of 10% to the larger eigenvalue.

The following exemplary embodiment illustrates the design methods described above for the PI-controller 325 for a controlled system with the following parameters:

$$\omega_0 = 2 \cdot \pi \cdot 9000 \, \text{Hz}$$

$$s_0 = \frac{\omega_0}{200000}$$

$$A = s_0^2 + \omega_0^2$$

$$T_S = \frac{\pi}{4 \cdot \omega_0} \quad \beta_S = \frac{\pi}{4 \cdot \omega_0 \cdot T}$$

$$T = \frac{1}{100000 \, \text{Hz}}$$

As the phase generated by the system dead time at the resonance frequency $\omega_0$ is less than 90°, a phase ratio of 180° can be realized by an inverting controller (minus sign in the controller). For the controller dead time $\beta_D T$ the dimensioning rule according to equation (44) then results from equation (24b):

$$\beta_D = \frac{\pi}{4 \cdot \omega_0 \cdot T} - \frac{1}{2} = 0.8\overline{88} \tag{44}$$

According to a method that provides dimensioning of the discrete PI-controller 325 by pole/zero compensation the amplification factor $K_P$ can be, for example, set to $K_P = -\frac{1}{10}$ in analogy to the example illustrated in FIG. 2C. The integral action coefficient $K_I$ results then from equation (32) to $K_I \cdot T = -2.8274 \cdot 10^{-7}$.

FIG. 3C illustrates, in the left column from top to bottom, absolute value frequency responses for the controlled system, the controller, the corrected open loop, and the closed loop and, in the right column, the corresponding phase frequency responses for the calculated exemplary embodiment. From the frequency responses of the closed loop a bandwidth of about 500 Hz within the 3 dB limits can be read off.

When, in contrast, the discrete PI-controller 325 is dimensioned via eigenvalue presetting, the eigenvalues are chosen for example equally large and according to absolute value, such that the closed loop of the equivalent baseband system has a double real eigenvalue at $\lambda_1 = \lambda_2 = 0.98$. The controller coefficients $r_1 = 0.14004655$ and $r_2 = 1{,}41471261 \cdot 10^{-3}$ result from equations (42a) and (42b). Taking into account the minus sign required for the phase adjustment, the values for the amplification factor $K_P$ and the integral action coefficient $K_I$ of the discrete PI-controller 325 are $K_P = -0.14004655$ and $K_I \cdot T = -1{,}41471261 \cdot 10^{-3}$.

Figure 3E:
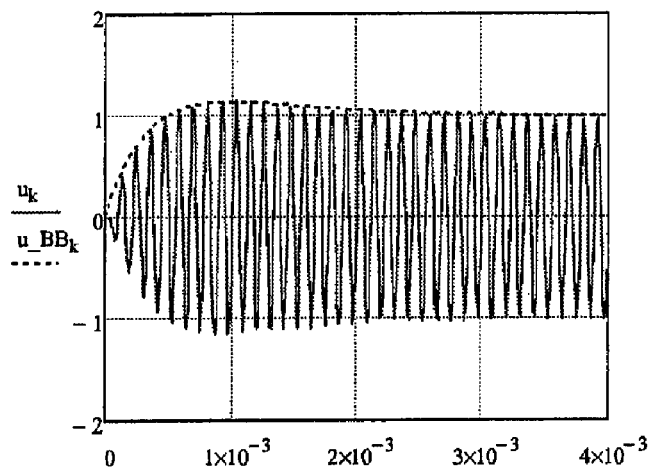
FIG. 3E comprises a set of schematic frequency response diagrams of a discrete controller unit dimensioned according to one embodiment of a method for manufacturing a controller unit including determination of the controller parameter by eigenvalue specification.
Figure 3E:
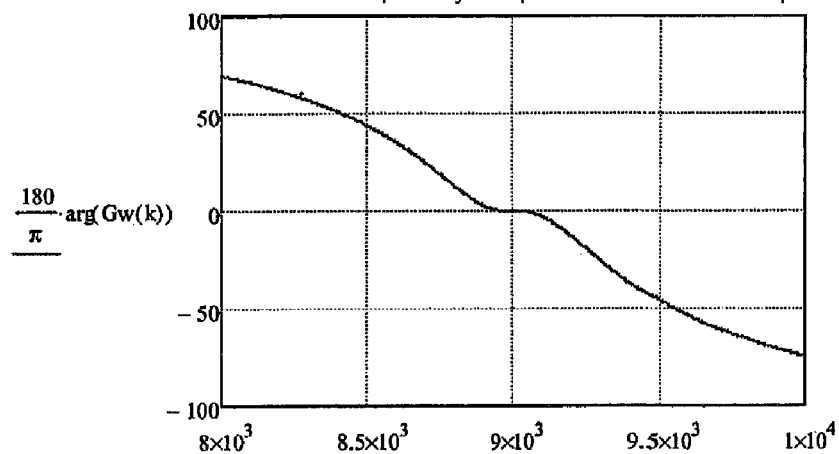
Figure 3E:
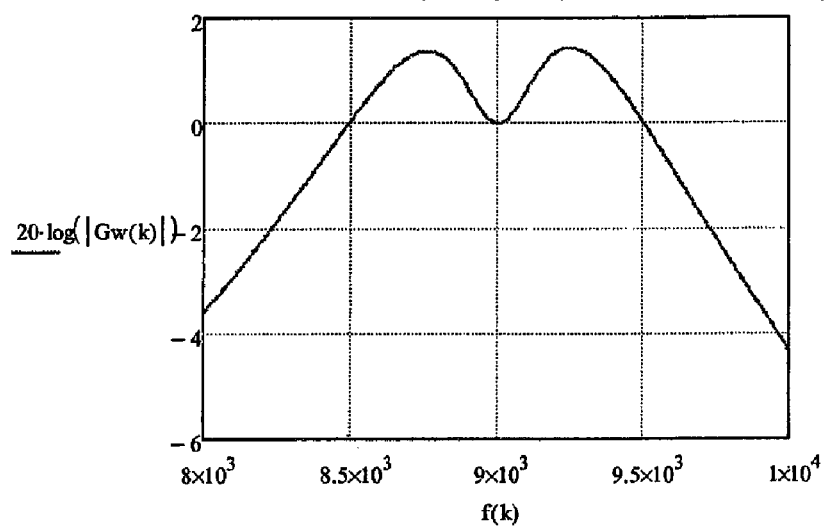

FIG. 3E illustrates in the upper diagram the step response of the bandbass band system controlled via such a discrete PI-controller as continuous line as well as the step response of the equivalent baseband system as dotted line, which corresponds approximately to the upper branch of the envelope of the step response of the discrete PI-controller. Lower left the absolute value frequency response of the closed bandpass band system and right next to it the corresponding phase frequency response is illustrated from which for example the bandwidth of the closed loop can read off.

Figure 4A:
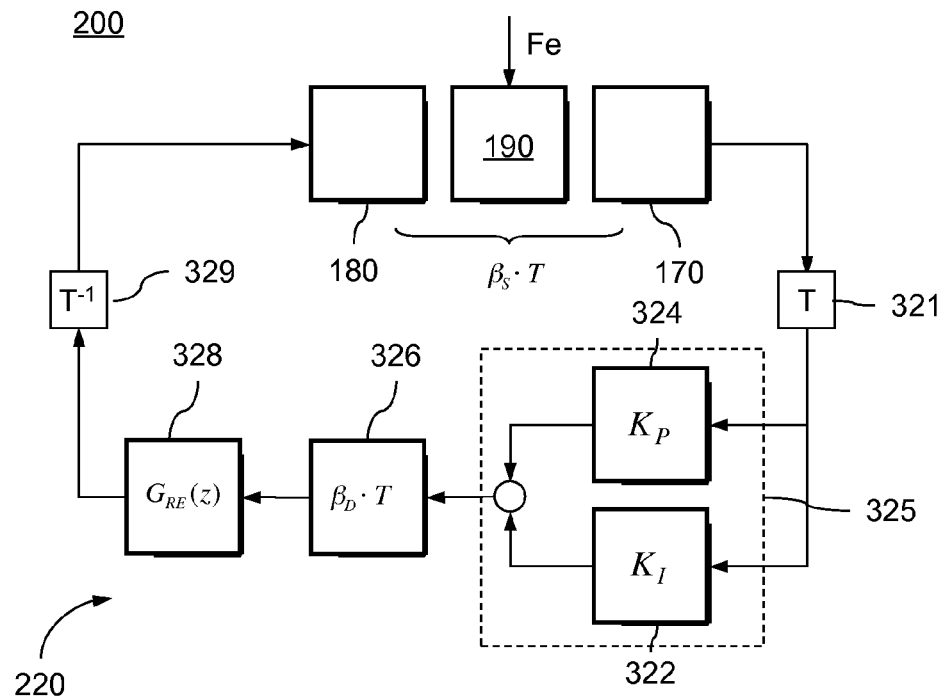
FIG. 4A is a schematic block diagram of a device with a controller unit according to a embodiment of the invention which refers to a controller unit with a discrete PI-controller for command variables and a controller extension working similarly to a bandpass.
Figure 4B:
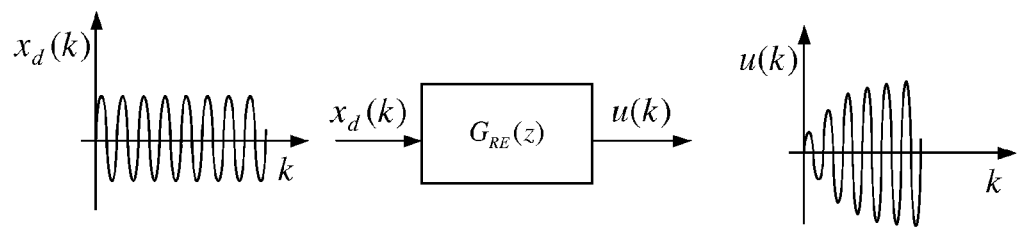
FIG. 4B schematically illustrates the transfer function of the controller extension according to FIG. 4A.
Figure 4C:
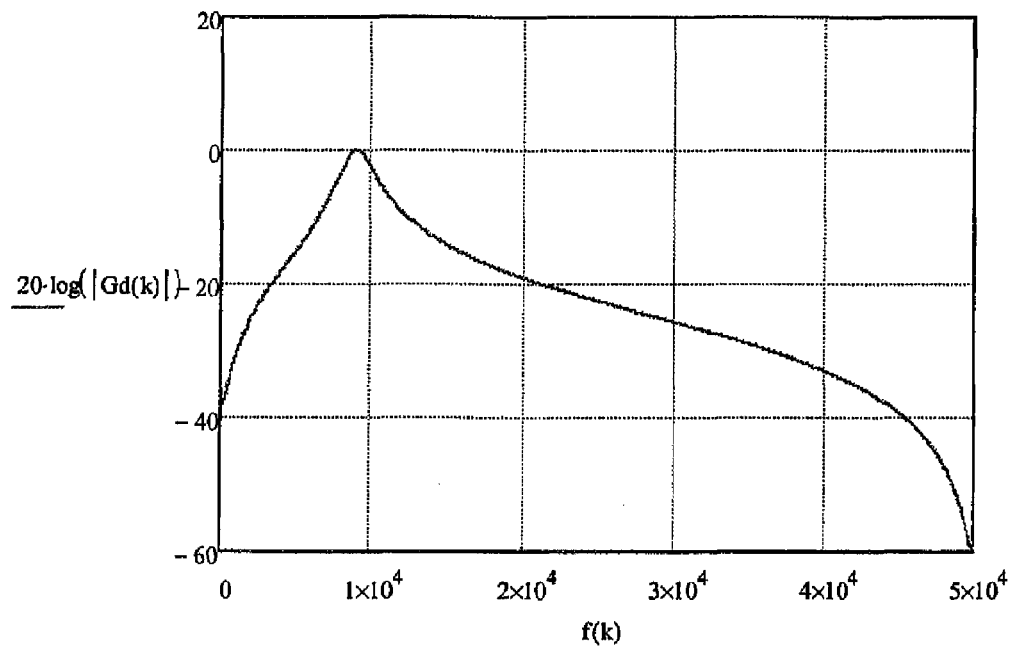
FIG. 4C comprises frequency response diagrams for explanation of the operation of the controller extension according to FIG. 4A.
Figure 4C:
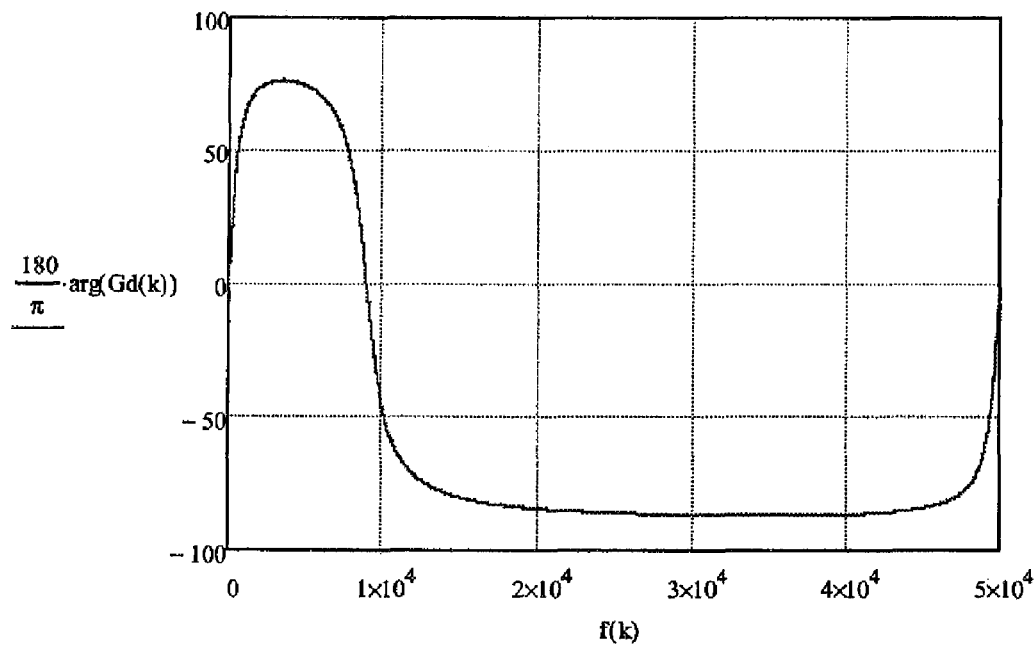

FIGS. 4A to 4C refer to an embodiment at which the controller unit 320 has a controller extension 328, arranged in series with the PI-controller 325, and a dead time element 326 according to FIG. 3A. In the following, the structure of the controller extension 328 is deduced from an analog controller extension for the baseband.

The oscillator 190 can have further resonances beside the resonance angular frequency at $\omega_0$, such as mechanic structure resonances above or below the resonance angular frequency $\omega_0$. The controller extension 328 is formed such that these further resonances are more strongly damped. To this end, a retardation element of first order ($PT_1$-element) with a further pole at the kink frequency beyond the desired bandwidth would be added to a conventional PI-controller in the baseband. This additional controller pole causes the controller to no longer act as a proportional element for high frequencies, but its absolute value frequency drops down with 20 db/decade. The step response $y(k)$ of such an extension in the baseband results from the step function $\sigma(k)$ as input signal $u(k)$ according to equation (45):

$$y(k) = \left(1 - e^{-\frac{k \cdot T}{T_1}}\right) \cdot \sigma(k) \tag{45}$$

The z transform $U(z)$ of the input signal $u(k)$ corresponds to the z transform of the step signal:

$$U(z) = \frac{z}{z - 1} \tag{46a}$$

The z transform $Y(z)$ of the output signal $y(k)$ then results:

$$Y(z) = \frac{z}{z - 1} - \frac{z}{z - e^{-\frac{T}{T_1}}} \tag{46b}$$

The transfer function $G_{RE0}(z)$ of such a controller extension in the baseband is derived, thus, in analogy to equation (10):

$$G_{RE0}(z) = \frac{1 - e^{-\frac{T}{T_1}}}{z - e^{-\frac{T}{T_1}}} \tag{47}$$

According to one embodiment, the controller extension 238 in the bandpass band is configured now in analogy to the controller extension in the baseband such that the controller extension 328 responses to an admission with a harmonic oscillation of a resonance angular frequency $\omega_0$ modulated by the step function with a harmonic oscillation of the same frequency, wherein the step response of the baseband extension defines the envelope as illustrated on the right side of FIG. 4B.

FIG. 4B illustrates the transformation of a sign modulated step function $u(k)$ onto an output signal with sign oscillation whose envelope results from the step response according to the transfer function $G_{RE0}(z)$ of the discrete controller extension in the bandpass band. The input signal of the controller extension 328 in the bandpass band with the transfer function $G_{RE}(z)$ is expressed in equation (48):

$$u(k) = \sin(\omega_0 \cdot T \cdot k) \cdot \sigma(k) \tag{48}$$

The controller output signal $y(k)$ is a harmonic oscillation whose envelope corresponds to the step response of the $PT_1$-controller extension in the baseband:

$$y(k) = \left(1 - e^{-\frac{k \cdot T}{T_1}}\right) \cdot \sin(\omega_0 \cdot T \cdot k) \cdot \sigma(k) \tag{49}$$

The z-transform $U(z)$ and $Y(z)$ are set forth in equations (50a) and (50b) below:

$$U(z) = \frac{z \cdot \sin(\omega_0 \cdot T)}{z^2 - 2 \cdot \cos(\omega_0 \cdot T) \cdot z + 1} \tag{50a}$$

$$Y(z) = z \cdot \frac{\sin(\omega_0 \cdot T)}{z^2 - 2 \cdot \cos(\omega_0 \cdot T) \cdot z + 1} - z \cdot \frac{e^{-\frac{T}{T_1}} \cdot \sin(\omega_0 \cdot T)}{z^2 - 2 \cdot e^{-\frac{T}{T_1}} \cdot \cos(\omega_0 \cdot T) \cdot z + e^{-2\frac{T}{T_1}}} \tag{50b}$$

The transfer function $G_{RE}(z)$ of the controller extension 328 for the bandpass band follows:

$$G_{RE}(z) = \frac{Y(z)}{U(z)} = \frac{\left(1-e^{-\frac{T}{T_1}}\right)\cdot z^2 - e^{-\frac{T}{T_1}}\cdot\left(1-e^{-\frac{T}{T_1}}\right)}{z^2 - 2\cdot e^{-\frac{T}{T_1}}\cdot\cos(\omega_0\cdot T)\cdot z + e^{-2\frac{T}{T_1}}} \quad (51)$$

The controller extension 328 with the transfer function $G_{RE}(z)$ acts in series with the discrete PI-controller 325 similarly to a bandpass of first order with the resonance frequency $\omega_0$ as midband frequency. The absolute value and phase of the compensated open loop at the resonance angular frequency $\omega_0$ in a narrow region around the resonance angular frequency $\omega_0$ according to equation (52) remain unchanged.

$$\omega_0 - \frac{1}{T_1} \leq \omega \leq \omega_0 + \frac{1}{T_1} \quad (52)$$

In this region, the absolute value frequency response of the compensated open loop is barely affected, while, out of this region, a considerable drop of the absolute value happens such that possible undesired resonances can be dropped. FIG. 4C illustrates the absolute value frequency response as well as the phase frequency response for the controller extension for $T_1 = 1/(2\cdot\pi\cdot 1000$ Hz) with a transfer function $G_{RE}(z)$ according to equation (51).

Figure 5A:
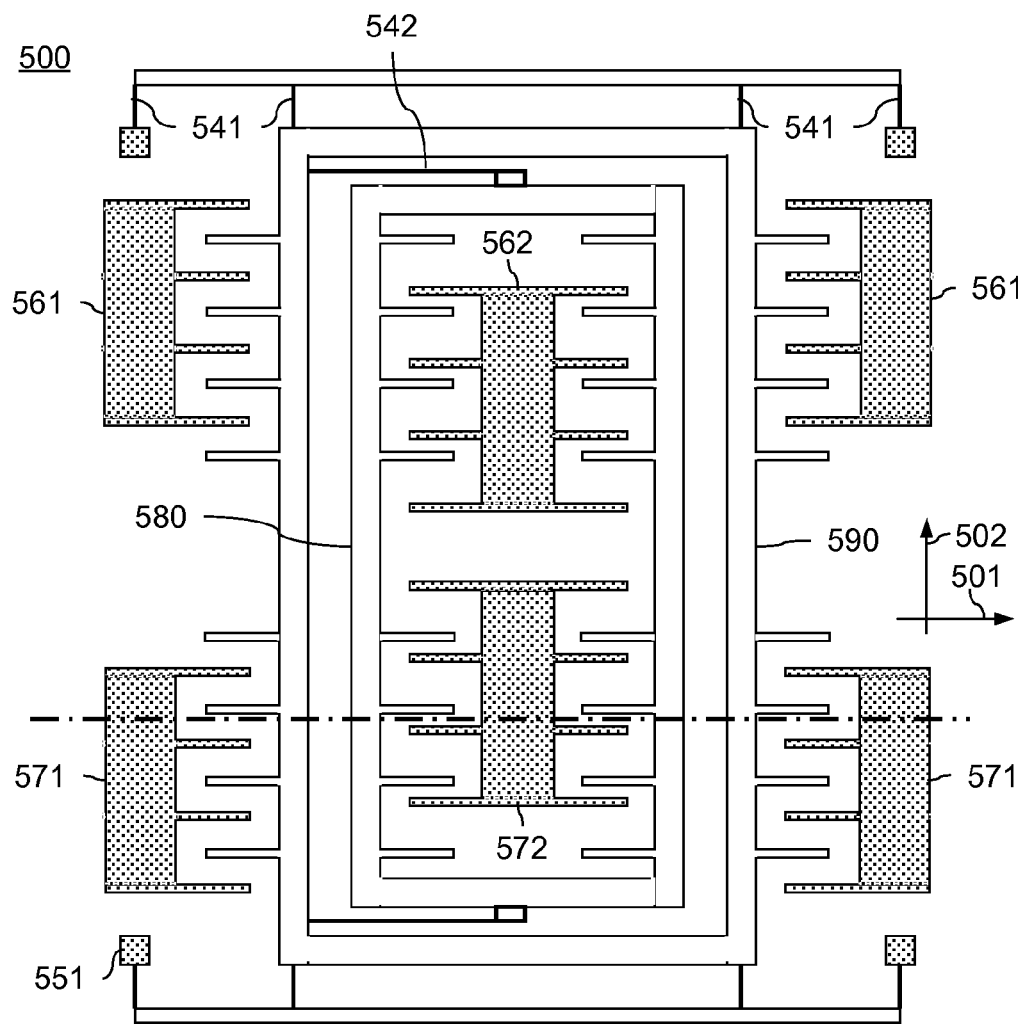
FIG. 5A is a top plan view of the micromechanical portion of a rotation rate sensor according to a further embodiment of the invention.
Figure 5B:
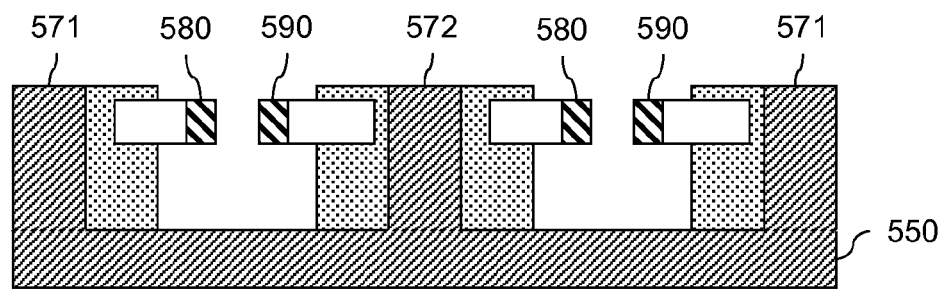
FIG. 5B is a cross-sectional view in elevation of the micromechanical portion of the rotation rate sensor of FIG. 5A.
Figure 5C:
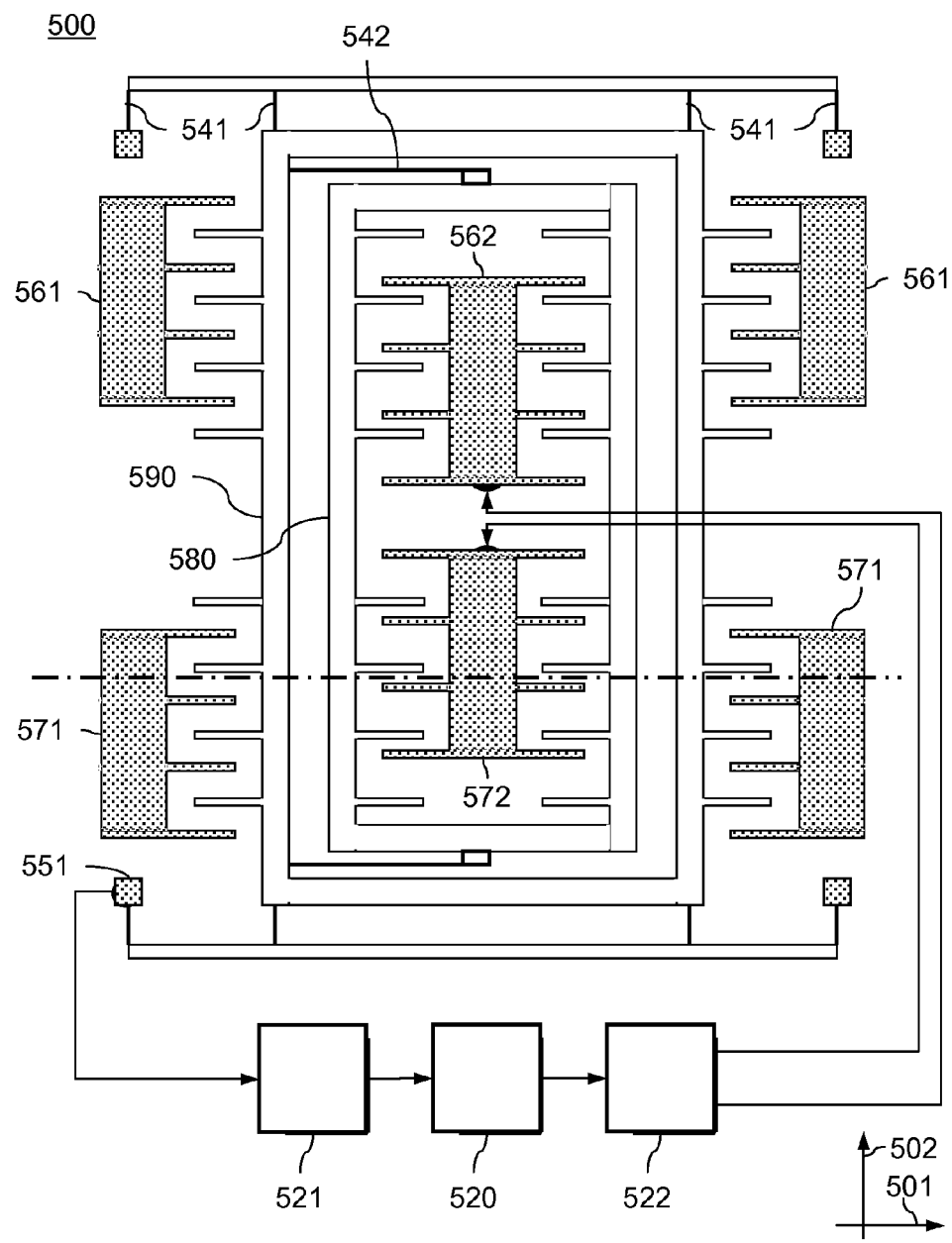
FIG. 5C is a schematic block diagram of the rotation rate sensor of FIGS. 5A and 5B.

FIGS. 5A to 5C refer to a micromechanical rotation rate sensor 500 according to a further embodiment. The rotation rate sensor 500 includes an excitation unit 590, e.g. an excitation frame, suspended at first spring elements 541. The first spring elements 541 couple the excitation unit 590 to an attachment structure 551 which is fixedly connected to a support substrate 550 illustrated in FIG. 5B. The spring elements 541 only weakly damp a deflection of the excitation unit 590 with respect to the support substrate 550 along the direction of excitation 501. A detection unit 580 is coupled to the excitation unit 590 over second spring elements 542 and is movable with respect to the excitation unit 590 mainly along a detection direction 502 orthogonal to the direction of excitation 501. The direction of excitation 501 and the detection direction 502 run parallel to a surface of the support substrate 550. The first and second spring elements 541, 542 are, for example, beam-like structures with small cross sections, which are formed between each of the structures to be coupled.

According to one embodiment, the rotation rate sensor 500 includes first force transmission and sensor units 561, 571 (e.g. electrostatic force transmitters and sensors) which excite the system formed from the excitation unit 590 and the detection unit 580 to an oscillation along the direction of excitation 501 and/or are able to capture a corresponding deflection of the excitation unit 590. The rotation rate sensor 500 includes further second force transmission and sensor units 562, 572 (e.g. electrostatic force transmitters and sensors) which act on the detection unit 580 and/or are able to capture its deflection. According to one embodiment at least one of the second force transmission and sensor units 562, 572 is controlled such that it counteracts a deflection of the detection unit 580, caused by a disturbance or, in a closed loop system, caused by a measured variable.

During operation of the rotation rate sensor 500, the first force transmission and sensor units 561, 571 excite, for example, the excitation unit 590 to an oscillation along the direction of excitation 501, wherein the detection unit 580 moves approximately with the same amplitude and phase with the excitation unit 590. When the arrangement is rotated around the axis orthogonal to the substrate plane, a Coriolis force acts on the excitation unit 590 and the detection unit 580, which deflects the detection unit 580 with respect to the excitation unit 590 in the detection direction 502. The second force transmission and sensor units 562, 572 capture the deflection of the deflection unit 580 and, thus, the rotational movement around the axis orthogonal to the substrate plane.

According to one embodiment, at least one of the force transmission and sensor units 561, 572, 562, 572 acts as actuator and either the excitation unit 590 or the detection unit 580 as oscillator within the meaning of one of the devices 200 described above.

According to one embodiment illustrated in FIG. 5C of the rotation rate sensor 500, the first force transmission and sensor units 561, 571 excite the excitation unit 590 to oscillation with the resonance angular frequency $\omega_0$ along the direction of excitation 501. In a control loop according to the above discussion, an oscillation of the detection unit 580 along the detection direction 502 (x2-oscillator) can then for example correspond to the harmonic force signal as described above.

The deflection of the x2-oscillator can be captured via the charge on the common movable electrode, which is formed on the excitation unit 590. The charge can be measured via the attachment structure 551. A charge amplification unit 521 amplifies the measured signal. While typically a demodulation unit modulates the measured signal with a frequency which corresponds for example to the resonance angular frequency $\omega_0$ before it is fed into a controller unit, the embodiments of the invention feed the non-demodulated harmonic signal as measurement signal within the meaning described above into a controller unit 520 according to the above.

The damping $s_0$ for the oscillation is considerably smaller than the resonance angular frequency $\omega_0$. The signal measured over the excitation frame the excitation unit 590 partly reproduces the movement of the excitation unit 590 along the direction of excitation 501. A disturbance whose source can be outside of the rotation rate sensor 500, or, in a closed loop system, the measurement variable, respectively, superposes the oscillation and modulates its amplitude. The controller unit 520 senses from the modulated harmonic signal a control signal for the second force transmission and sensor units 562, 572 which counteracts the deflection effected by the disturbance or the measurement variable, respectively. An amplification unit 522 transforms the control signal in a suitable reset signal for the electrodes of the second force transmission and sensor units 562, 572. The controller unit 520 is formed and dimensioned according to one of the above described controller units 220. When the amplitude modulation of the harmonic signal reproduces the measurement variable, a demodulation unit can be provided, which generates the rotation rate signal by demodulation of the harmonic control signal with the resonance angular frequency $\omega_0$.

Figure 6:
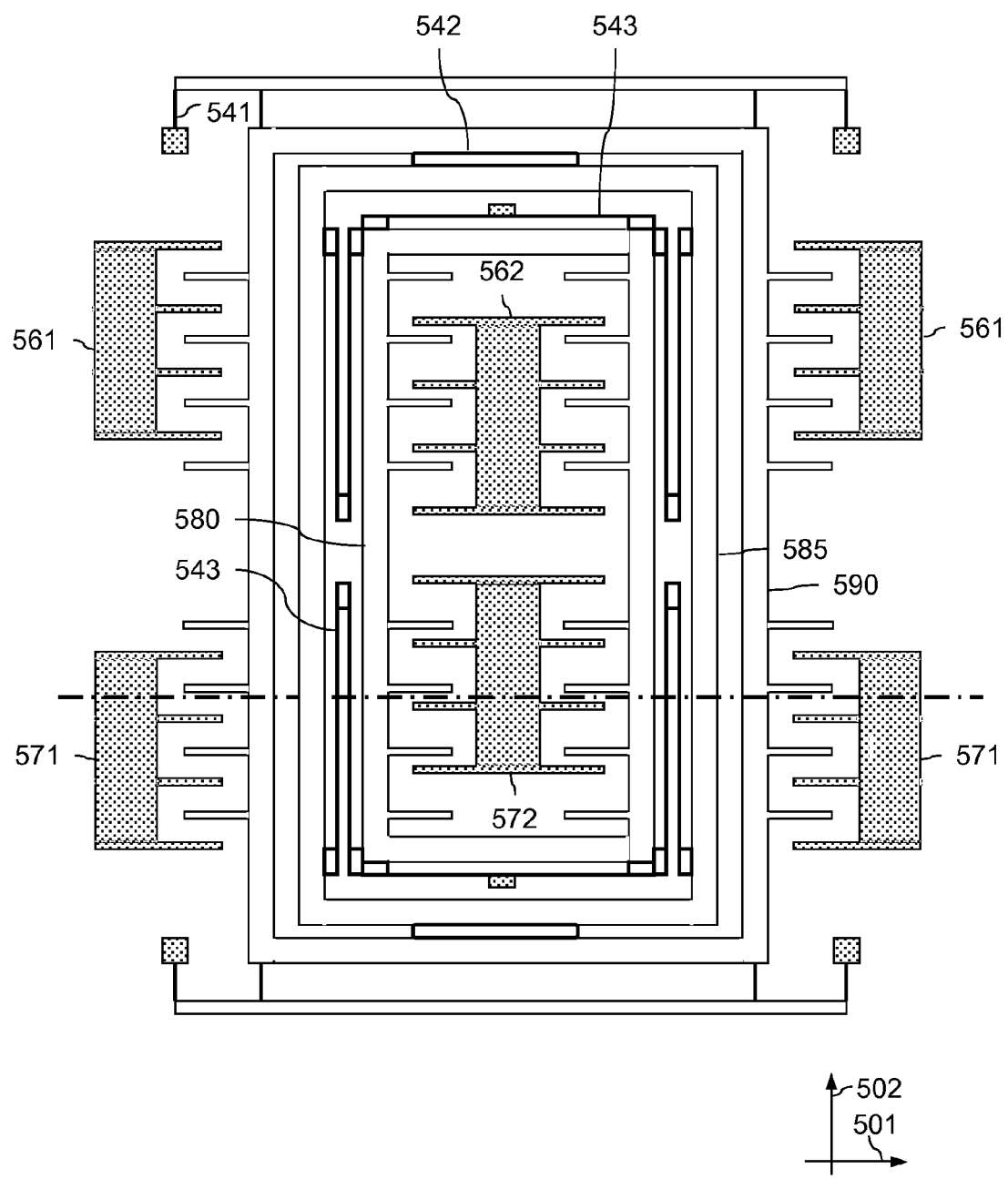
FIG. 6 is a top plan view of the micromechanical part of a rotation rate sensor according to yet another embodiment of the invention.

The rotation rate sensor 505 illustrated in FIG. 6 differs from the rotation rate sensor 500 illustrated in FIG. 5A by a Coriolis unit 585 arranged between the excitation unit 590 and the detection unit 580. Second spring elements 542 which couple the Coriolis unit 585 to the excitation unit 590 allow for a deflection of the Coriolis unit 585 relative to the excitation unit 590 in the detection direction 502. Third spring elements 543, which can be partly connected with the support substrate 550, couple the detection unit 580 to the Coriolis unit 585 so that the detection unit 580 can follow the movement of the Coriolis unit 585 along the detection direction 502, but cannot follow movements along the direction of excitation 501. The detection unit 580 is fixed with respect to the direction of excitation 501 and is moveable along the detection direction 502.

According to another embodiment, at least one of the first or second force transmission and sensor units 561, 562, 571, 572 acts as actuator and either the excitation unit 590 or the detection unit 580 or the excitation unit 590 as well as the detection unit 580 act as oscillator according to one of the devices described above, which are operated according to the principle of the bandpass controller. In this process the force transmission and sensor units 561 and 571 act as force transmission and sensor units respectively for the x1-oscillator and the force transmission and sensor units 562 and 572 act as force transmission and sensor units respectively for the x2-oscillator.

A rotation rate sensor according to another embodiment includes two of the arrangements as illustrated in FIG. 5A or FIG. 6, which are coupled to each other such that the excitation units perform opposing oscillations in the stationary state with respect to each other. Another embodiment covers rotation rate sensors with four of the arrangements as illustrated in FIG. 5A or FIG. 6 which are coupled to each other such that every two of the excitation units perform opposing oscillations in the stationary state.

A further embodiment refers to the controller unit 220 illustrated in FIGS. 2A, 3A and 4A. The controller unit 220 includes at least one PI-controller 225, 325 for harmonic command variables, which has a proportional transfer element 224, 324 and an integrating transfer element 222, 322 arranged in parallel to the proportional transfer element 224, 324, wherein a controller unit of the controller unit 220 is connected with both transfer elements 222, 224, 322, 324. The transfer function of the PI-controller 225, 325 for harmonic command variables has a conjugate complex pole at a controller angular frequency $\omega_r$ in the s-plane or at $e^{\pm j\omega_r T}$ in the z-plane, wherein T is the sampling time of a discrete input signal of the PI-controller 325 and wherein $\omega_r$ is larger than 0.

To achieve this, the integral action coefficient of the integrating transfer elements 222, 322 and a amplification factor of the proportional transfer elements 224, 324 is chosen such that the PI-controller 225, 325 for harmonic command variables is suitable for generating a harmonic oscillation of the controller angular frequency $\square_r$ with rising amplitude at a controller output, with an harmonic input signal of the controller angular frequency $\omega_r$ modulated by the step function at the controller input.

The PI-controller 225, 325 for harmonic command variables can also be employed for a controller derived from a conventional PI-controller for stationary command variables and differs from it by the position of the poles in the s- or z-plane, respectively.

Figure 7A:
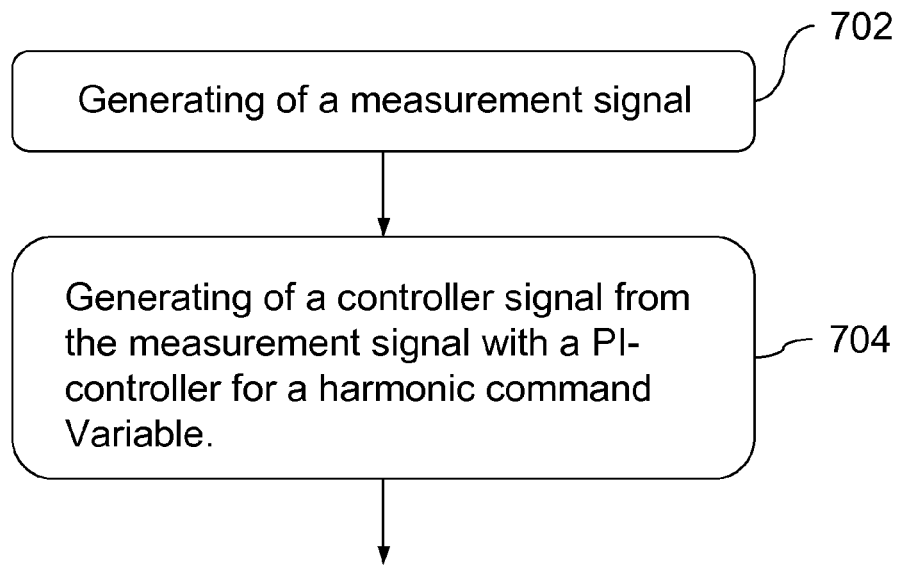
FIG. 7A is a simplified flow diagram of a method of operation of a rotation rate sensor in accordance with the invention.

FIG. 7A refers to a method for operating a rotation rate sensor. During operation of a rotation rate sensor, a sensor generates a measurement signal, which reproduces a deflection of an oscillator (702). A controller unit generates a control signal from the measurement signal for an actuator, which counteracts the deviation of the deflection of the oscillator from a harmonic oscillation with the resonance angular frequency $\omega_0$ (704). The controller unit has a PI-controller with a proportional transfer element and an integrating transfer element arranged parallel to the proportional transfer element, wherein a controller input of the controller unit is connected with both transfer elements. The transfer function of the PI-controller has a conjugate complex pole at a resonance angular frequency $\omega_0$ of the oscillator in the s-plane or a pole at $e^{\pm j\omega_r T}$ in the z-plane. T is the sampling time of a discrete input signal of the PI-controller and $\omega_0$ is larger than zero.

Figure 7B:
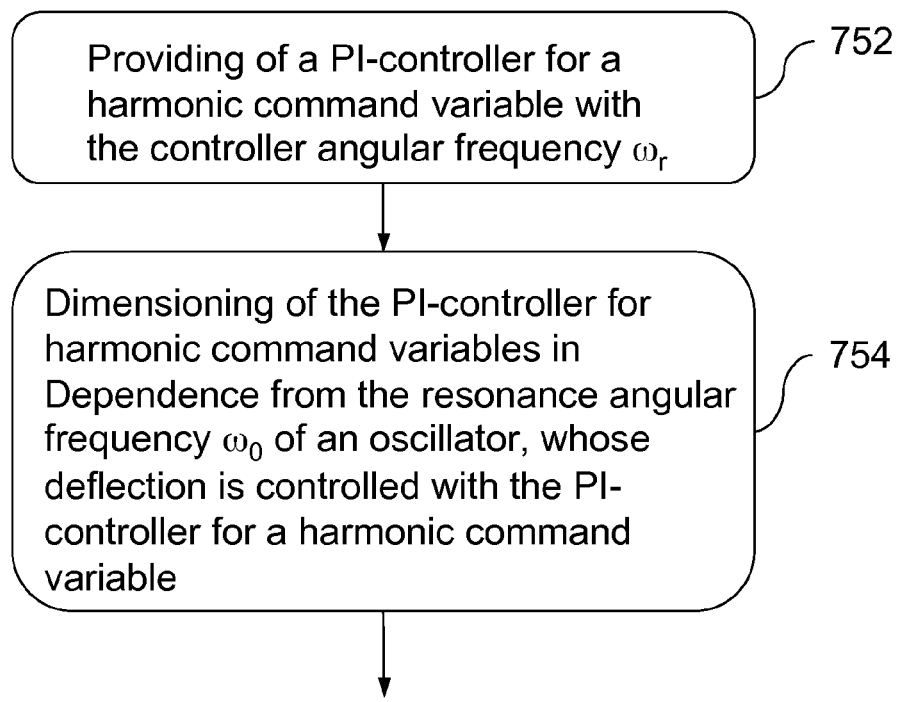
FIG. 7B is a flow diagram of a method for manufacturing a rotation rate sensor in accordance with the invention.

FIG. 7B refers to a method for manufacturing a rotation rate sensor. The method includes dimensioning a controller unit with the PI-controller with a proportional transfer element and an integrating transfer element arranged parallel to the proportional transfer element, wherein a controller input of the controller unit is connected with both transfer elements. The PI-controller is provided with a transfer function, which has a conjugate complex pole at a controller angular frequency $\omega_r$ in the s-plane or a pole at $e^{\pm j\omega_r T}$ the z-plane, wherein T is the sampling time of a discrete input signal of the PI-controller and $\omega_r$ is larger than 0. The controller angular frequency $\omega_r$ is chosen such in this process that the controller angular frequency $\omega_r$ is equal to the resonance angular frequency $\omega_0$ of an oscillator of the rotation rate sensor (754). To this end an integral action coefficient of the integrating transfer element and an amplification factor of the proportional transfer element are chosen such that the PI-controller is suitable for generating a harmonic oscillation of the angular resonance frequency $\omega_0$ with rising amplitude at the controller output, at admission of the harmonic input signal of the resonance angular frequency $\omega_0$ modulated with the step function at the controller input.

While the invention has been described with reference to a presently preferred embodiment, it is not limited thereto. Rather it is limited only insofar as it is defined by the following set of patent claims and includes within its scope all equivalents thereof.

What is claimed is:

1. A controller unit comprising a PI-controller with a proportional transfer element and an integrating transfer element, arranged parallel to the proportional transfer element, wherein a controller input of the controller unit is connected with both transfer elements, characterized in
   that a transfer function of the PI-controller has a conjugate complex pole at a controller angular frequency $\omega_r$ in the s-plane or a pole at $e^{\pm j\omega_r T}$ in the z-plane, wherein T is the sampling time of a discrete input signal of the PI-controller and $\omega_r$ is larger than 0.

2. The controller unit according to claim 1, wherein
   an integral action coefficient of the integrating transfer element and an amplification factor of the proportional transfer element are chosen such that the PI-controller is suitable for generating, at admission with a harmonic input signal of the controller angular frequency $\omega_r$ modulated by the step function at the controller input, a harmonic oscillation of the controller angular frequency $\omega_r$ with rising amplitude at the controller output.

3. A device comprising a moveably supported oscillator, which is excitable to an oscillation with the resonance angular frequency $\omega_0$ along a direction of excitation, and
   the controller unit according to claim 2, wherein the controller angular frequency $\omega_r$ is equal to the resonance angular frequency $\omega_0$.

4. The device according to claim 3, wherein
   the integral action coefficient and the amplification factor are chosen such that the zeros of the transfer function of the PI-controller compensate poles of a transfer function of the oscillator.

5. The device according to claim 3, wherein
   the PI-controller is a continuous PI-controller and
   the ratio of integral action coefficient to amplification factor is equal to a damping $s_0$ of the oscillator in the direction of excitation.

6. The device according to claim 5, wherein
   a controlled system comprising the oscillator has a system dead time $T_S$,
   the controller unit comprises in series to the PI-controller a dead time element with a controller dead time $T_R$, and either
   the PI-controller is an inverting controller and the product of the resonance angular frequency $\omega_0$ and the sum of the system dead time $T_S$ and the controller dead time $T_R$ is equal to $\pi/2$ or
   the PI-controller (225) is a non-inverting controller and the product of the resonance angular frequency $\omega_0$ and the sum of the system dead time $T_S$ and the controller dead time $T_R$ is equal to $3\pi/2$.

7. The device according to claim 3, wherein
   the PI-controller is a discrete PI-controller, which is admittable with a discrete input signal emerging from a sampling with the sampling time T,
   the oscillator has a damping $s_0$ in the direction of excitation, and the ratio of the integral action coefficient to the amplification factor equals the ratio $s_0:(1-s_0 \cdot T)$.

8. The device according to claim 3, wherein
the PI-controller is a discrete PI-controller, which is admittable with a discrete input signal emerging from a sampling with the sampling time T,
the integral action coefficient and the amplification factor are chosen such that the transfer function of the closed loop of an equivalent baseband system has a double real eigenvalue.

9. The device according to claim 7, wherein
a controlled system comprising the oscillator has a system dead time $\beta_s \cdot T$,
the controller unit comprises a dead time element with a controller dead time $\beta_D \cdot T$ in series to the discrete PI-controller, and either
the discrete PI-controller is an inverting controller and the product from the resonance angular frequency $\omega_0$ and the sum of the system dead time $\beta_s \cdot T$, controller dead time $\beta_D \cdot T$, and the half sampling time $T/2$ is equal to $\pi/2$ or
the discrete PI-controller is a non-inverting controller and the product of the resonance angular frequency $\omega_0$ and the sum of the system dead time $\beta_s \cdot T$, the controller dead time $\beta_D \cdot T$, and the half sampling time $T/2$ is equal to $3\pi/2$.

10. The device according to claim 3, characterized by
a controller extension, arranged in series to the PI-controller, which acts as bandpass with a midband frequency at the resonance angular frequency $\omega_0$.

11. The device according to claim 10, wherein
a transfer function $G_{RE}(z)$ of the controller extension with a bandwidth $1/T_1$ is determined by the following equation:

$$G_{RE}(z) = \frac{\left(1 - e^{-\frac{T}{T_1}}\right) \cdot z^2 - e^{-\frac{T}{T_1}} \cdot \left(1 - e^{-\frac{T}{T_1}}\right)}{z^2 - 2 \cdot e^{-\frac{T}{T_1}} \cdot \cos(\omega_0 \cdot T) \cdot z + e^{-2\frac{T}{T_1}}}$$

12. The device according to claim 3, wherein
the device is a rotation rate sensor and the oscillator is an excitation unit, a Coriolis unit or a detection unit of the rotation rate sensor, wherein
the excitation unit is deflectable by a force transmitter along a direction of excitation and is suitable for an oscillation with the resonance angular frequency $\omega_0$,
the Coriolis unit is attached to the excitation unit such that the Coriolis unit follows a movement of the excitation unit along the direction of excitation and that the Coriolis unit is additionally moveable along a detection direction orthogonal to the direction of excitation, and
the detection unit is attached such to the excitation unit or to the Coriolis unit that the detection unit either
follows a movement of the excitation unit along the direction of excitation and is additionally moveable along a detection direction orthogonal to the direction of excitation, or
follows a movement of the Coriolis unit along a detection direction orthogonal to the direction of excitation and is fixed along the direction of excitation.

13. A rotation rate sensor comprising
a moveably supported oscillator which is excitable in a direction of excitation to an oscillation with a resonance angular frequency $\omega_0$, and
a controller unit comprising a PI-controller with a proportional transfer element and an integrating transfer element, arranged parallel to the proportional transfer element, wherein a controller input of the controller unit is connected with both transfer elements, characterized in that
the transfer function of the PI-controller has a conjugate complex pole at the resonance angular frequency $\omega_0$ in the s-plane or at $e^{\pm j\omega_0 T}$ in the z-plane, wherein T is the sampling time of a discrete input signal of the PI-controller and $\omega_0$ is larger than 0.

14. The rotation rate sensor according to claim 13, wherein
the oscillator is an excitation unit which is deflectable by a force transmitter along a direction of excitation and is suitable for an oscillation with the resonance angular frequency $\omega_0$.

15. A method for operating a rotation rate sensor, comprising
generating a measurement signal by a sensor reproducing a deflection of an oscillator, and
generating a controller signal for an actuator from the measurement signal, wherein the actuator counteracts the deviation of the oscillator from a harmonic oscillation with the resonance angular frequency $\omega_0$, the controller signal is deduced by means of a controller unit from the measurement signal, and the controller unit comprises a PI-controller with a proportional transfer element and an integrating transfer element, arranged parallel to the proportional transfer element, wherein a controller input of the controller unit is connected with both transfer elements, wherein
a transfer function of the PI-controller has a conjugate complex pole at the resonance angular frequency $\omega_0$ in the s-plane or a pole at $e^{\pm j\omega_0 T}$ in the z-plane, wherein T is the sampling time of a discrete input signal of the PI-controller.

16. A method for manufacturing a rotation rate sensor, comprising
dimensioning a controller unit comprising a PI-controller with a proportional transfer element and an integrating transfer element, arranged parallel to the proportional transfer element, wherein a controller input of the controller unit is connected with both transfer elements, characterized in
that the PI-controller is provided with a transfer function that has a conjugate complex pole at a controller angular frequency $\omega_r$ in the s-plane or a pole at $e^{\pm j\omega_r T}$ in the z-plane, wherein T is the sampling time of a discrete input signal of the PI-controller and $\omega_r$ is larger than 0 and an integral action coefficient of the integrating transfer element and an amplification factor of the proportional transfer element are chosen such that the PI-controller is suitable for generating, at admission with a harmonic input signal of controller angular frequency $\omega_r$, modulated by the step function at the controller input, a harmonic oscillation of the controller angular frequency $\omega_r$ with rising amplitude at the controller output, and
the controller angular frequency $\omega_r$ is chosen such that the controller angular frequency $\omega_r$ is equal to the resonance angular frequency $\omega_0$ of an excitation unit of the rotation rate sensor.

17. The method according to claim 16, wherein
the integral action coefficient and the amplification factor are chosen such that the zeros of the transfer functions of the PI-controller compensate the poles of the transfer functions of the excitation unit.

18. The method according to claim 16, wherein
the PI-controller is a discrete PI-controller, which is admittable with a discrete input signal emerged from a sampling with sampling time T, and
the integral action coefficient and the amplification factor are chosen such that the transfer function of the closed loop of an equivalent baseband system has a double real eigenvalue.

* * * * *